(12) United States Patent
Krishnamoorthy et al.

(10) Patent No.: US 10,006,963 B2
(45) Date of Patent: Jun. 26, 2018

(54) PACKET TRACKING IN A VERIFICATION ENVIRONMENT

(71) Applicant: CAVIUM, INC., San Jose, CA (US)

(72) Inventors: Harish Krishnamoorthy, San Jose, CA (US); Nimalan Siva, San Ramon, CA (US); Vadana Desai, San Jose, CA (US)

(73) Assignee: Cavium, Inc., San Jose, CA (US)

( * ) Notice: Subject to any disclaimer, the term of this patent is extended or adjusted under 35 U.S.C. 154(b) by 569 days.

(21) Appl. No.: 14/672,016

(22) Filed: Mar. 27, 2015

(65) Prior Publication Data

US 2016/0142280 A1     May 19, 2016

Related U.S. Application Data

(60) Provisional application No. 62/080,174, filed on Nov. 14, 2014, provisional application No. 62/080,158, filed on Nov. 14, 2014, provisional application No. 62/080,214, filed on Nov. 14, 2014, provisional application No. 62/080,194, filed on Nov. 14, 2014,
(Continued)

(51) Int. Cl.
| | |
|---|---|
| *G01R 31/3177* | (2006.01) |
| *G06F 17/50* | (2006.01) |
| *G06F 11/36* | (2006.01) |
| *G01R 31/317* | (2006.01) |
| *G01R 31/3183* | (2006.01) |
| *G06F 11/22* | (2006.01) |
| *G06F 11/263* | (2006.01) |
| *H04L 12/26* | (2006.01) |

(52) U.S. Cl.
CPC ... *G01R 31/3177* (2013.01); *G01R 31/31727* (2013.01); *G01R 31/318314* (2013.01); *G06F 11/2273* (2013.01); *G06F 11/263* (2013.01); *G06F 11/364* (2013.01); *G06F 17/5009* (2013.01); *G06F 17/5081* (2013.01); *H04L 43/14* (2013.01); *H04L 43/50* (2013.01)

(58) Field of Classification Search
CPC .......... G01R 31/3177; G01R 31/31727; G01R 31/318314; G06F 11/2273; G06F 11/263; G06F 17/5009; G06F 17/5081; G06F 11/364; H04L 43/14; H04L 43/50
USPC .... 714/724, 735, 738, 742, 33, 39; 702/117, 702/118
See application file for complete search history.

(56) References Cited

U.S. PATENT DOCUMENTS

| | | | | |
|---|---|---|---|---|
| 5,847,751 | A | * | 12/1998 | Safadi ................. H04J 3/1694 348/E5.006 |
| 6,154,464 | A | | 11/2000 | Feuerstraeter |
| 6,182,258 | B1 | | 1/2001 | Hollander |

(Continued)

FOREIGN PATENT DOCUMENTS

| | | |
|---|---|---|
| GB | 2336076 A | 6/1999 |

*Primary Examiner* — John J Tabone, Jr.
(74) *Attorney, Agent, or Firm* — Haverstock & Owens LLP

(57) ABSTRACT

A testbench, including a verification environment, tests a device under test (DUT). A packet tracking module, which is verification environment agnostic, is configured to track packets in the verification environment. The packet tracking module maintains an associative data structure of packet identifiers that are indexed by a unique value, a counter for identifying the packets in the verification environment, and a set of routines for tracking the packets in the verification environment during different stages of the testing.

32 Claims, 24 Drawing Sheets

Related U.S. Application Data provisional application No. 62/080,235, filed on Nov. 14, 2014.

(56) References Cited

U.S. PATENT DOCUMENTS

| | | | |
|---|---|---|---|
| 6,216,098 B1 | 4/2001 | Clancey | |
| 6,253,365 B1 | 6/2001 | Baldwin | |
| 6,377,912 B1 | 4/2002 | Sample et al. | |
| 6,434,517 B1 | 8/2002 | Le | |
| 6,665,864 B1 | 12/2003 | Kawahito et al. | |
| 6,667,985 B1 | 12/2003 | Drummond-Murray | |
| 6,694,464 B1 | 2/2004 | Quayle et al. | |
| 6,728,271 B1 * | 4/2004 | Kawamura | H04H 40/18 370/311 |
| 6,754,612 B1 | 6/2004 | Vanfladern et al. | |
| 6,876,941 B2 | 4/2005 | Nightingale | |
| 7,130,783 B1 | 10/2006 | Harer et al. | |
| 7,185,247 B2 | 2/2007 | Mak et al. | |
| 7,236,918 B2 | 6/2007 | Roesner | |
| 7,237,210 B2 | 6/2007 | Likovich, Jr. et al. | |
| 7,246,332 B2 | 7/2007 | Likovich, Jr. et al. | |
| 7,284,177 B2 | 10/2007 | Hollander et al. | |
| 7,325,018 B2 | 1/2008 | Smith | |
| 7,472,051 B2 | 12/2008 | Mariani | |
| 7,506,281 B1 | 3/2009 | Secatch | |
| 7,519,865 B1 | 4/2009 | Maly | |
| 7,526,742 B1 | 4/2009 | Edwards | |
| 7,565,631 B1 | 7/2009 | Banerjee et al. | |
| 7,796,627 B2 | 9/2010 | Hurley et al. | |
| 8,214,694 B1 * | 7/2012 | McKechnie | G06F 11/364 326/16 |
| 8,560,893 B1 | 10/2013 | Hollander et al. | |
| 8,832,622 B1 | 9/2014 | Xu | |
| 8,984,490 B1 | 3/2015 | Dahan | |
| 9,135,382 B1 | 9/2015 | Lu et al. | |
| 9,322,872 B2 | 4/2016 | Hill | |
| 9,330,227 B1 | 5/2016 | Han et al. | |
| 9,506,982 B2 | 11/2016 | Han et al. | |
| 9,506,984 B1 | 11/2016 | Vaishampayan | |
| 9,547,041 B2 | 1/2017 | Siva | |
| 9,606,176 B2 * | 3/2017 | Miller | G01R 31/3177 |
| 9,626,321 B2 * | 4/2017 | Safranek | G06F 13/4022 |
| 2002/0054608 A1 * | 5/2002 | Wan | H03M 13/2707 370/474 |
| 2002/0183956 A1 | 12/2002 | Nightingale | |
| 2003/0110339 A1 | 6/2003 | Calvignac | |
| 2003/0225565 A1 | 12/2003 | Garcia | |
| 2005/0108596 A1 | 5/2005 | Deaton | |
| 2005/0157653 A1 | 7/2005 | Zeitak | |
| 2006/0190871 A1 | 8/2006 | Likovich, Jr. et al. | |
| 2007/0217759 A1 | 9/2007 | Dodd | |
| 2007/0264730 A1 | 11/2007 | Frodsham | |
| 2007/0277163 A1 | 11/2007 | Avresky | |
| 2008/0098366 A1 | 4/2008 | Fong | |
| 2009/0144675 A1 | 6/2009 | Haufe | |
| 2010/0031000 A1 * | 2/2010 | Flynn | G06F 17/30949 711/216 |
| 2010/0306728 A1 | 12/2010 | Adeishar et al. | |
| 2011/0010720 A1 | 1/2011 | Smith et al. | |
| 2011/0063093 A1 | 3/2011 | Fung et al. | |
| 2011/0145795 A1 | 6/2011 | Khanapurkar et al. | |
| 2011/0307233 A1 | 12/2011 | Ryzhyk | |
| 2012/0174068 A1 | 6/2012 | Gutfleisch et al. | |
| 2012/0198174 A1 * | 8/2012 | Nellans | G06F 12/0804 711/133 |
| 2012/0255022 A1 | 10/2012 | Ocepek et al. | |
| 2012/0284432 A1 | 11/2012 | Chen et al. | |
| 2012/0284446 A1 | 11/2012 | Biran et al. | |
| 2012/0300649 A1 | 11/2012 | Parmar et al. | |
| 2013/0007330 A1 | 1/2013 | Ryzhyk et al. | |
| 2013/0028105 A1 * | 1/2013 | Chew | H04L 43/026 370/252 |
| 2013/0080761 A1 | 3/2013 | Garrett et al. | |
| 2013/0081005 A1 | 3/2013 | Gounares et al. | |
| 2013/0198706 A1 * | 8/2013 | Mehta | G06F 11/261 716/111 |
| 2013/0318486 A1 | 11/2013 | Sasaki | |
| 2014/0068360 A1 * | 3/2014 | Lai | G11C 29/08 714/718 |
| 2014/0112339 A1 * | 4/2014 | Safranek | G06F 12/0831 370/389 |
| 2014/0244888 A1 | 8/2014 | Kallickal | |
| 2014/0282312 A1 | 9/2014 | Stamness et al. | |
| 2014/0289445 A1 | 9/2014 | Savich | |
| 2015/0161385 A1 | 6/2015 | Gounares et al. | |
| 2015/0234008 A1 * | 8/2015 | Miller | G01R 31/3177 714/734 |
| 2015/0286470 A1 | 10/2015 | Dahan | |
| 2015/0301108 A1 | 10/2015 | Hamid et al. | |
| 2016/0092329 A1 | 3/2016 | Musunuri et al. | |
| 2016/0134653 A1 | 5/2016 | Vallone et al. | |
| 2016/0139202 A1 | 5/2016 | Patel et al. | |
| 2016/0139204 A1 | 5/2016 | Han et al. | |
| 2016/0139205 A1 | 5/2016 | Siva et al. | |
| 2016/0140006 A1 | 5/2016 | Siva et al. | |
| 2016/0140284 A1 | 5/2016 | Han et al. | |
| 2016/0140285 A1 | 5/2016 | Han et al. | |
| 2016/0140286 A1 | 5/2016 | Siva et al. | |
| 2016/0142280 A1 | 5/2016 | Krishnamoorthy et al. | |
| 2016/0366036 A1 | 12/2016 | Gupta et al. | |

* cited by examiner

PACKET TRACKING IN A VERIFICATION ENVIRONMENT

RELATED APPLICATIONS

This application claims priority under 35 U.S.C. § 119(e) of the U.S. provisional patent application Ser. No. 62/080,174, filed Nov. 14, 2014, and titled "TESTBENCH BUILDER, SYSTEM, DEVICE AND METHOD INCLUDING A GENERIC DRIVER AND TRANSPORTER," the U.S. provisional patent application Ser. No. 62/080,158, filed Nov. 14, 2014, and titled "TESTBENCH BUILDER, SYSTEM, DEVICE AND METHOD," the U.S. provisional patent application Ser. No. 62/080,214, filed Nov. 14, 2014, and titled "TESTBENCH BUILDER, SYSTEM, DEVICE AND METHOD INCLUDING A DISPATCHER," the U.S. provisional patent application Ser. No. 62/080,194, filed Nov. 14, 2014, and titled "TESTBENCH BUILDER, SYSTEM, DEVICE AND METHOD INCLUDING A GENERIC MONITOR AND TRANSPORTER," and the U.S. provisional patent application Ser. No. 62/080,235, filed Nov. 14, 2014, and titled "TESTBENCH BUILDER, SYSTEM, DEVICE AND METHOD HAVING AGENT LOOPBACK FUNCTIONALITY," all of which are hereby incorporated by reference.

FIELD OF INVENTION

The present invention relates to testbenches. More particularly, the present invention relates to packet tracking in a verification environment.

BACKGROUND OF THE INVENTION

When developing components for integration into a system, a number of test procedures are typically performed to ensure that the component will operate in the desired manner when integrated into the system. The development of a hardware component (also referred to herein as a device) typically takes place in a number of stages. Firstly, the functional operation/behavior of the component is defined, for example using a Register Transfer Language (RTL). Two popular RTLs used are VHDL and Verilog. In addition, prior to performing such RTL coding, a behavioral model may be built using a UML™ (Universal Modeling Language) to validate at a transactional level that the design intent is correct. Once an RTL representation of the hardware component has been developed, this is then synthesised into a sequence of hardware elements using any of a number of known synthesising tools. The result of the synthesis is a hardware design that can then be used to produce the actual hardware component, for example using appropriate fabrication of the component on silicon. It is costly to perform test procedures on the component once it has been reduced to hardware. Thus, testing of the RTL representation of the component is typically performed to ensure that the actual hardware generated from that RTL representation will operate correctly.

Such testing of the RTL representation typically involves the use of a testbench model providing a test environment for the RTL representation of the component, which is then run on a simulation tool to produce test results which can be analyzed to determine whether the RTL representation of the component is operating as required. The testbench can be formed in a variety of ways. For example, the testbench could be formed to provide a test environment for testing the RTL representation of the component in isolation, which enables direct control of the input stimuli to the RTL representation of the component. However, this requires a particular testbench to be produced for that component representation. Another approach is to combine that RTL representation of the component to be tested with RTL representations of other components that have already been tested, and with which the component to be tested will interact. Hence, in this approach, a portion of the overall system into which the component is intended to be placed is represented in RTL, and a testbench is then constructed based on that RTL representation of the system portion. This avoids the need to produce a particular testbench specifically for the component to be tested, but results in loss of direct control over the input stimuli to the RTL representation of the particular component to be tested.

BRIEF SUMMARY OF THE INVENTION

A testbench, including a verification environment, tests a device under test (DUT). A packet tracking module, which is verification environment agnostic, is configured to track packets in the verification environment. The packet tracking module maintains an associative data structure of packet identifiers that are indexed by a unique value, a counter for identifying the packets in the verification environment, and a set of routines for tracking the packets in the verification environment during different stages of the testing.

In one aspect, a testbench system stored on a non-transitory computer readable medium for testing operation of a device under test is provided. The testbench system includes a packet tracking module that is generic to a plurality of different verification environments. The packet tracking module includes an associative data structure of packet identifiers that are indexed by a unique value, a counter for identifying packets in a verification environment during the testing, and a set of routines for tracking the packets in the verification environment at different stages of the testing.

In some embodiments, the set of routines is called by one or more components of the verification environment. In some embodiments, the one or more components of the verification environment includes a generator, a reference model and a checker. The generator generates packets during the testing, the reference model mimics operation of the device under test, and the checker performs comparisons of data received from the reference model and from the device under test.

In some embodiments, information of each of the packets is stored as an entry in the associative data structure. The entry is updated each time the corresponding packet is processed, and the entry is deleted from the associative data structure when the entry is no longer needed.

In some embodiments, the set of routines includes a routine (issuePktId) for issuing a packet identifier based on the counter, a routine (insertPktId) for inserting an entry of a packet into the associative data structure, a routine (fetchPktId) for fetching a packet identifier from the associative data structure, a routine (removePktId) for removing an entry from the associative data structure, and a routine (eraseTbl) for clearing all entries in the associative data structure. In some embodiments, the eraseTbl routine is called before the testing starts, after the testing completes or both. In some embodiments, the set of routines allows tracking of one or more of an unmodified packet, a modified packet, a replicated packet, a merged packet.

In some embodiments, higher order bits of the unique value contains a segment number, wherein the segment number indicates a whole packet or which split packet. In some embodiments, a combined value of the segment number and a CRC value is used as an index into the associative data structure. In some embodiments, the segment number of a packet is stored in the payload of the packet.

In another aspect, a packet tracking module is provided. The packet tracking module is stored on a non-transitory computer readable medium and is verification environment agnostic. The packet tracking module includes an associative data structure of packet identifiers that is indexed by a unique value, a counter for identifying packets in the verification environment during simulation, and a set of routines for tracking the packets in the verification environment at different stages of the simulation.

In some embodiments, the packet tracking module tracks packets in a verification environment. In some embodiments, the verification environment is for testing operation of a device under test. In some embodiments, the verification environment includes a generator, a reference model and a checker. The generator generates packets during the testing, the reference model mimics operation of the device under test, and the checker performs comparisons of data received from the reference model and from the device under test.

In some embodiments, the set of routines includes a routine (issuePktId) for issuing a packet identifier based on the counter, a routine (insertPktId) for inserting an entry of a packet into the associative data structure, a routine (fetchPktId) for fetching a packet identifier from the associative data structure, a routine (removePktId) for removing an entry from the associative data structure, and a routine (eraseTbl) for clearing all entries in the associative data structure. In some embodiments, each routine in the set of routines has no parameters, has only a unique value as a parameter, or has only a unique value and a packet identifier as parameters.

In some embodiments, the unique value is a combination of a segment number and a CRC. In some embodiments, the segment number is stored in a payload of a packet.

In some embodiments, a packet identifier for a packet is stored in a payload of the packet, wherein the packet identifier is based on the counter.

In yet another aspect, a method of tracking packets within a verification environment of a testbench is provided. The method includes instantiating a packet tracking module, wherein the packet tracking module is verification environment agnostic, maintaining a counter and an associative data structure by the packet tracking module, generating a first packet in the verification environment, in response to generating the first packet, performing a first set of procedures, thereby storing information of the first packet as an entry in the associative data structure and updating the counter, and performing one or more subsequent sets of procedures each time the first packet is processed, thereby updating the entry in the associative data structure.

In some embodiments, the verification environment includes a generator, a reference model and a checker. The generator generates the packet, the reference model mimics operation of a device under test, and the checker performs comparisons of data received from the reference model and from the device under test.

In some embodiments, the first set of procedures includes requesting a packet identifier for the first packet from the packet tracking module, returning the packet identifier for the first packet by the packet tracking module, wherein the packet identifier for the first packet is based on the counter, inserting the packet identifier for the first packet into the first packet, calculating CRC of the first packet, and inserting the entry for the first packet into the associative data structure using the packet identifier for the first packet and the CRC of the packet.

In some embodiments, the one of the one or more subsequent sets of procedures includes obtaining a modified packet, wherein the modified packet is modified from the first packet, wherein the modified packet includes the packet identifier for the first packet, calculating CRC of the modified packet, removing the entry for the first packet from the associative data structure, and inserting an entry for the modified packet into the associative data structure using the packet identifier and the CRC of the modified packet.

In some embodiments, the one of the one or more subsequent sets of procedures includes obtaining a replicated packet, wherein the replicated packet is replicated from the first packet, requesting a packet identifier for the replicated packet from the packet tracking module, returning the packet identifier for the replicated packet by the packet tracking module, wherein the packet identifier for the replicated packet is based on the counter, inserting the packet identifier for the replicated packet into the replicated packet, calculating CRC of the replicated packet, and inserting an entry for the replicated packet into the associative data structure using the packet identifier for the replicated packet and the CRC of the replicated packet.

In some embodiments, the one of the one or more subsequent sets of procedures includes obtaining a first split packet and a second split packet from the first packet, wherein the first split packet includes a first portion of fields of the first packet and the packet identifier for the first packet, and wherein the second split packet includes a second portion of fields of the first packet and the packet identifier for the first packet, calculating CRC of each of the two split packets, inserting an entry for the first split packet into the associative data structure using the packet identifier and a combination of a segment number of the first split packet and the CRC of the first split packet, inserting a new entry for the second split packet into the associative data structure using the packet identifier and a combination of a segment number of the second split packet and the CRC of the second split packet, and removing the entry for the first packet from the associative data structure.

In some embodiments, the one of the one or more subsequent sets of procedures includes obtaining a merged packet from the first split packet and the second split packet, calculating CRC for the merged packet, inserting a new entry for the merged packet into the associative data structure using the packet identifier and a combination of a segment number of the merged packet and the CRC of the merged packet, removing the entry for the first split packet from the associative data structure, and removing the entry for the second split packet from the associative data structure.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Embodiments described herein are directed to a testbench for testing a device under test (DUT), wherein the testbench has a verification environment that is able to include one or more of a reference model, a scoreboard, a dispatcher and a customized agent for each interface that the DUT needs to receive input from and/or transmit output on. The testbench system is able to comprise agents with generic drivers, generic monitors, loopback ports and/or interface specific transporters which handle interface/DUT specific handshake protocols and/or the monitoring thereof. The testbench system is able to be generated by a testbench builder configured to automatically generate a testbench for a device under test (DUT), wherein the generated testbench has a verification environment comprising one or more of a reference model, a scoreboard, a dispatcher and a customized agent for each interface that the DUT needs to receive input from and/or transmit output on. Specifically, the testbench builder is able to first automatically create generic agents including generic drivers, sequencers, loopback ports and/or generic monitors for each interface and then automatically customize the generic agents based on their corresponding interface such that the agents meet the requirements of the interface for the DUT. At the same time, the testbench builder is able to integrate all the customized agents into the verification environment, integrate the verification environment with register transfer level (RTL) ports, binding the outputs and/or inputs of the agents to other agents and/or RTL ports, and preparing a random sample test case for testing the DUT with the generated testbench. As a result, the testbench system provides the benefit of enabling the generic drivers and/or generic monitors to be generated independent of the interface characteristics such as handshake protocol. Additionally, the testbench builder is able to automatically create the entire testbench in minutes based on an interface file including the necessary interfaces and their characteristics for the DUT.

Figure 1:
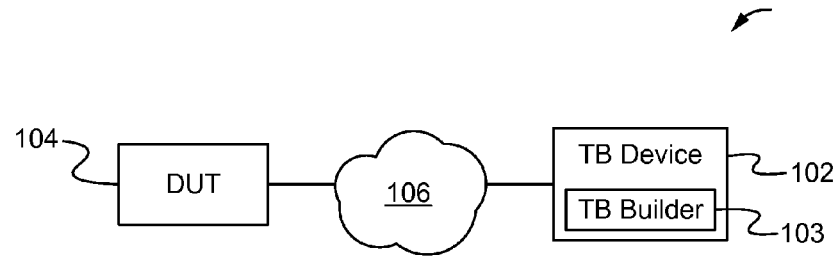
FIG. 1 illustrates a testbench builder system according to some embodiments.

FIG. 1 illustrates a testbench builder system 100 according to some embodiments. As shown in FIG. 1, the system 100 comprises a testbench builder device 102 storing a testbench builder application 103 and coupled with one or more DUTs 104 via one or more networks 106. Alternatively, the testbench builder application 103 is able to be stored on an external database that is accessed by the testbench builder device 102 via the networks 106. In some embodiments, the networks 106 comprise a wireless network. Alternatively, the networks 106 are able comprise a wired network or any combination of wired and wireless networks. In some embodiments, the DUT 104 is front end representation of the device implemented in RTL or other programming language. Alternatively, the DUT 104 is able to be a physical device, such as a prototype device. The DUT 104 is able to be stored on a memory of and/or incorporated into the testbench builder device such that the network 106 comprises an internal or local network of the device 102 such as the interfaces described herein. For example, the DUT 104 generated in RTL or another programming language is able to interact with the testbench 202 (see FIG. 2) generated by the testbench builder application 103 in UVM™ or other language via one or more interfaces 222 (see FIG. 2). Alternatively, in such embodiments the DUT 104 is able to be stored on the memory of one or more additional computing devices (e.g a server, computer) such that the networks 106 comprise external networks coupling together the testbench builder device 102 and DUT 104 via the additional computing devices. To put it another way, the DUT 104 is able to comprise hardware, emulation software or combination thereof. For example, the DUT 104 is able to be a piece of code (e.g. RTL, gate level, System C models) which provides or emulates the functionality of a device that is desired to be tested. Although as shown in FIG. 1, only a single DUT 104 is coupled to the testbench builder device 102, any number of DUTs 104 and/or devices 102 are contemplated.

Figure 2:
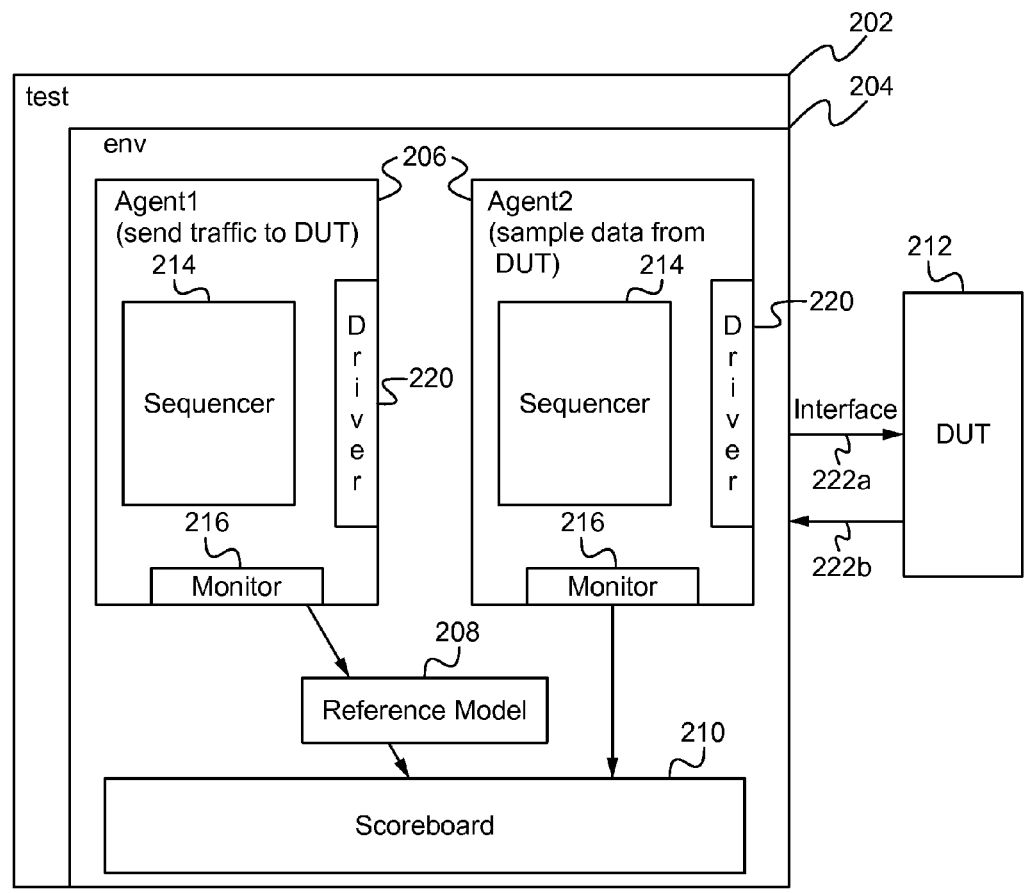
FIG. 2 illustrates a testbench according to some embodiments.

FIG. 2 illustrates a testbench 202 according to some embodiments. As shown in FIG. 2, the testbench 202 includes a verification environment 204 comprising one or more agents 206, one or more reference models 208 and one or more scoreboards 210 coupled with one or more DUTs 212 via one or more interfaces or virtual interfaces 222. In some embodiments, the verification environment 204 and the components therein are implemented in one or more verification methodologies (e.g. universal verification methodology (UVM™)). Although in FIG. 2 only two agents 206, two interfaces 222 and one DUT 212 are shown, any number of agents 206, interfaces 222 and DUTs 212 are contemplated. For example, in some embodiments the verification environment 204 comprises at least one agent 206 for each interface 222, wherein the DUT 212 is able to comprise numerous associated interfaces 222. Additionally, although described separately herein, in some embodiments one or more of the component of the verification environment 204 are able to be combined into a single component. For example, the one or more reference models 208 and the one or more scoreboards 210 are able to be combined into one or more single entities that perform the functions of both. Generally, each interface 222 (input or output) requires both control and data signals for communication. The data signals carry the information upon which the DUT 212 operates and the control signals define the significance of the data signals on that cycle. As also shown in FIG. 2, the agents 206 each comprise one or more sequencers 214, one or more monitors 216 and one or more drivers 220.

The monitors 216 are able to observe and/or sample pin level activity and converts its observations (e.g. observed output data signals from the agents 206 and/or DUT 212) to a format that is used within the verification environment 204 by the agents 206, reference model 208 and/or scoreboard 210. The drivers 220 are able to convert transactions received from the sequencers 214 for the device under test 212 from a format that is used within the verification environment 204 by the agents 206, reference model 208 and/or scoreboard 210 to a pin level configuration of the device under test 212. Alternatively, the agents 206 and/or testbench 202 are able to comprise more or less components such that one or more of the components are able to be replicated, omitted and/or new components are able to be added. For example, the testbench 202 is able to comprise a database of one or more test cases each including one or more stimulus patterns based on the DUT 212 for testing the DUT 212 with the testbench 202. In some embodiments, the testbench 202 and/or environment 204 is able to be coupled/integrated with the DUT 212 on a register transfer level. Alternatively, the coupling/integration of the testbench 202 and the DUT 212 is able to be with other communication levels.

In operation, the verification environment 204 provides the platform or operating system in which the agents 206, reference model 208 and scoreboard 210 are able to interoperate. Specifically, based on a test case being implemented by the testbench 202 and/or environment 204, the driver 220 of one or more of the agents 206 (e.g. agent 1) accepts data stimulus or testing data generated by the sequencer 214 in the form of a transaction and drives the data onto an interface 222a with which the agent 206 is associated (using a protocol for that DUT 212 and/or interface 222a). In other words, the sequencer 214 is able to coordinate the execution of stimulus in the form of sequences and sequence items from a parent sequence (e.g. test case), ultimately feeding the driver 220 with transactions. Additionally, the monitor 216 of the one or more of the agents 206 sends a copy of the data stimulus to the reference model 208 of the one or more agents 206. This reference model 208 is able to comprise one or more transfer functions configured such that it mimics an idealized operation of the DUT 212 for generated data stimulus. In other words, the reference model 208 is able to be configured to represent the behavior of a device under test 212 and/or a particular feature or features of the device under test 212 (e.g. common feature patterns) and in that way transform received transactions into "ideal" output transactions. As a result, upon receiving the data stimulus the reference model 208 is able to send modified reference data to the scoreboard 210, wherein the modified reference data represents the ideal output data for an ideal DUT 212 based on the inputted data stimulus. The scoreboard 210 is able to be configured to compare actual and expected values of the data received from the reference module 208 and the data received from the DUT 212 (e.g. via the monitor 216 of an agent 206). In some embodiments, the scoreboard 210 is also able to record statistical information about the data received and/or create reports based on that information.

At the same time, the DUT 212 receives the data stimulus from the driver 220 via the associated the interface 222a, performs an operation on the data and outputs the resulting DUT data on an appropriate output interface 222b. As a result, this outputted DUT data is able to be sampled by the monitor 216 of the agent 206 associated with the output interface 222b and sent to the scoreboard 210. The scoreboard 210 is then able to compare the DUT data to the reference data in order to determine any differences in behavior of the idealized DUT represented by the reference model 208 and the DUT 212 that is currently being tested. Specifically, based on these differences the scoreboard 210 is able to determine whether the DUT 212 is behaving within a set of operational limits for the test case and/or any operational errors that are indicated by the DUT data not matching the reference data. As a result, the testbench 202 is able to emulate a real world environment (e.g. test case) for the DUT 212 and ensure that the operation of the DUT 212 within that environment meets the expected operational standards. Additionally, it should be noted that although the operation described only included a DUT input and response, multiple inputs and/or responses (involving multiple agents 206 and/or interfaces 222) in sequence and/or in parallel are possible. For example, the reference model 208 is able to receive duplicates of all transactions or stimulus transmitted from one or a plurality of agents 206 to the DUT 212 and produce expected or ideal output transactions for all such received duplicates. Similarly, the scoreboard 210 is able to receive all expected or ideal output transactions from the reference module 208 as well as all transactions or stimulus transmitted from the DUT 212 to one or a plurality of the agents 206 such that all the corresponding transactions can be compared.

Figure 11:
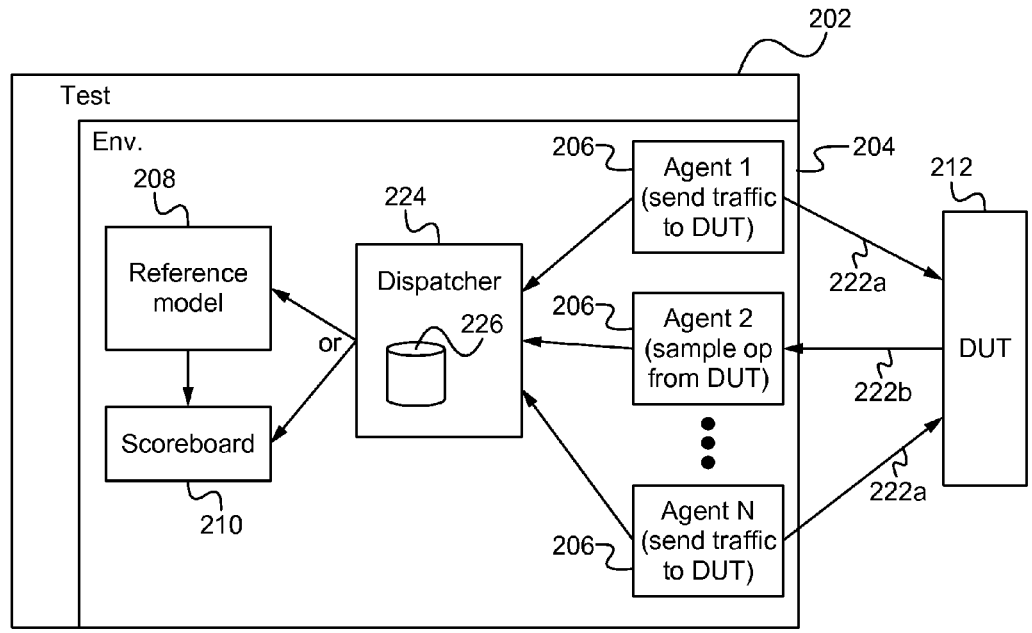
FIG. 11 illustrates a testbench according to some embodiments.

FIG. 11 illustrates an alternate embodiment of the testbench 202 according to some embodiments. The testbench 202 of FIG. 11 is able to be substantially similar to the testbench 202 of FIG. 2 except for the differences described herein. In particular, as shown in FIG. 11 instead of being coupled with either the reference model 208 or the scoreboard 210 directly as in FIG. 2, the agents 206 (e.g. via the monitors 216) are each coupled to the dispatcher 224 which is coupled to the reference model 208 and the scoreboard 210. This dispatcher 224 is able to comprise an agent table or database 226 that associates the agents 206 and/or their associated interfaces 222a, 222b (e.g. via the address of the ports of the dispatcher 224 that coupled to the agents 206) with the reference model 208 or the scoreboard 210. If the agent/interfaces receives device responses (e.g. modified transactions) from the DUT 212 (e.g. interface 222b), it is an "input" agent/interface that is associated with the scoreboard 210. Otherwise, if the agent/interface transmits transactions to the DUT 212 (e.g. interface 222a), it is an "output" agent/interface that is associated with the reference model 208. In other words, the associations in the agent table 224 represents which of the reference model 208 or the scoreboard 210 the agents 206 would be coupled directly to if the dispatcher 224 were omitted like in FIG. 2. In some embodiments, the agent table 226 comprises associations of the addresses of the ports that receive the data from the agents 206 with the address of the port coupled to the scoreboard 210 or the address of the port coupled to the reference model 208. Additionally, in some embodiments the agent table 226 is generated by the builder application based on the interface parameters and the binding of the ports within the verification environment.

In operation, unlike FIG. 2, the monitor 216 of the one or more of the agents 206 sends the copy of the data stimulus to the dispatcher 224 (not directly to the reference model 208), which then identifies the data as a transaction and routes the data stimulus to the reference model 208 based on the agent database 226. Also unlike FIG. 2, the outputted DUT data (e.g. device response) is sampled by the monitor 216 of the agent 206 and sent to the dispatcher 224 (not directly to the scoreboard 210), which then identifies the data as a device response and routes the response to the reference model 208 based on the agent database 226. Alternatively, the identification and/or routing of the data is able to be performed based on the packet data itself (e.g. header) without the agent table 224. In either case, the dispatcher 224 is able to act as a central routing hub thereby simplifying the connectivity required within the verification environment 204. Similar to FIG. 2, upon receiving the data stimulus the reference model 208 is able to send modified reference data to the scoreboard 210, wherein the modified reference data represents the ideal output data for an ideal DUT 212 based on the inputted data stimulus. Then the scoreboard 210 is able to compare actual and expected values of the data received from the reference module 208 and the data received from the DUT 212 (e.g. via the dispatcher 224).

Figure 12:
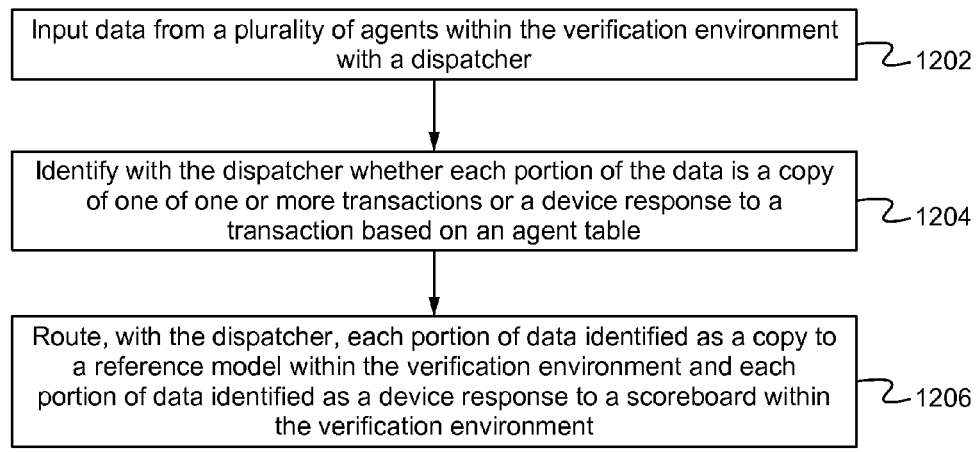
FIG. 12 illustrates a method of testing a device under test within a verification environment of a testbench according to some embodiments.

FIG. 12 illustrates a method of testing a device under test within a verification environment of a testbench according to some embodiments. Although described separately, one or more of the steps of the methods of FIGS. 6, 9, 12, 14 and/or 15 are able to be combined into a single method. For example, a method of operation of the testbench 202 or verification environment 204 as a whole is able to comprise a combination of one or more of the steps of all of the methods of FIGS. 6, 9, 12, 14 and 15 depending on the types of components (e.g. agents, transporters, dispatchers, loopback ports) within the environment 204. As shown in FIG. 12, the dispatcher 224 inputs data from the monitors 216 of a plurality of agents 206 within the verification environment 204 at the step 1202. The data input by the dispatcher 224 is able to be data transmitted on the interface 222 associated with each of the agents 206 and sampled by the monitor 216 of that agent 206, wherein after sampling, the monitor 216 forwards the data to the dispatcher 224. In some embodiments, the monitors 216 are able to be configured to automatically forward the sampled data (or a copy thereof) to a mailbox or queue of the dispatcher 224. Further, as described in FIGS. 6 and 9 below, the sampling by the monitors 216 and driving of transactions by the drivers 220 is able to be controlled or operate in concert with the associated transporters 506/806 (see FIGS. 5 and 8). As a result, the data is able to comprise transactions transmitted by a driver/transporter of an agent 206 onto an interface 222 to the DUT 212 or responses to a transaction generated and transmitted by the DUT 212 to an agent 206 via an interface 222.

The dispatcher 224 identifies whether each portion of the data is a transaction output by a driver/transporter (or a copy thereof) or a device response to a transaction output by the DUT 212 (or a copy thereof) based on the agent table 226 at the step 1204. In particular, the dispatcher 224 is able to look up the agent 206 or interface 222 that is the source/destination of the data (e.g. based on the port address of the port that received the data) within the agent table 226 and check whether the agent 206 or interface 222 is associated in the table with the scoreboard 210 or the reference model 208. For example, if the agent/interface is associated with the scoreboard 210, it is an "input" agent/interface that receives responses from the DUT 212 and if the agent/interface is associated with the reference model 208, it is an "output" agent/interface that transmits transactions to the DUT 212. The dispatcher 224 routes each portion of data identified as a transaction output by a driver/transporter to a reference model 208 within the verification environment and each portion of data identified as a device response to a transaction output by the DUT 212 to a scoreboard 210 within the verification environment 204 at the step 1206. In other words, based on whether the data is "input" or "output" data in the agent table 226 the dispatcher 224 is able to transmit the data to the port coupled with the scoreboard 210 or the reference model 208. As a result, the method provides the benefit of having a central dispatcher 224 that reduces the connection complexity of the verification environment 204. In particular, the dispatcher 224 provides a single component that all the agents 206 are able to be coupled and automatically send data to instead of each agent needing a separate connection established to either the reference model 208 or a single line to the scoreboard 210. As a result, the dispatcher 224 is able to efficiently route the data either on a single connection to the reference model 208 or a single line to the scoreboard 210.

Figure 13:
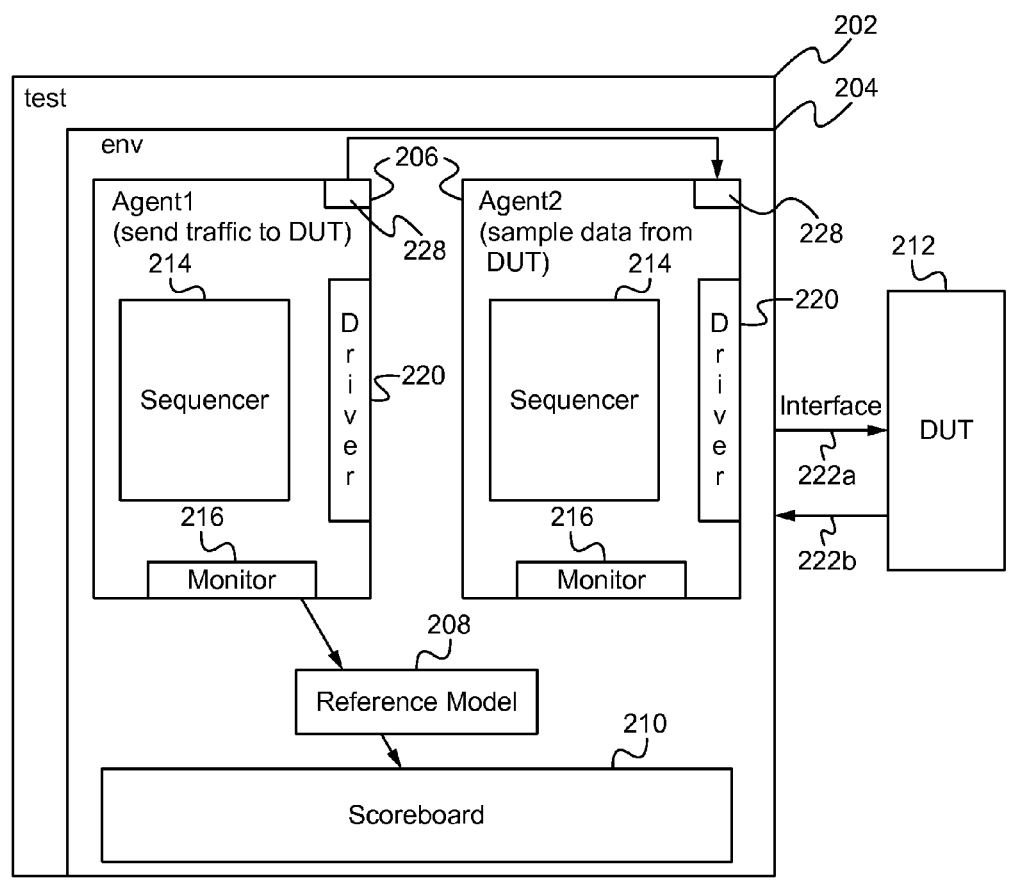
FIG. 13 illustrates a testbench with agents having coupled loopback ports according to some embodiments.

FIG. 13 illustrates an alternative embodiment of the testbench 202 according to some embodiments. The testbench 202 of FIG. 13 is able to be substantially similar to the testbench 202 of FIGS. 2 and/or 11 except for the differences described herein. In particular, as shown in FIG. 13 one or more of the agents 206 within the verification environment 204 are able to comprise and/or be coupled with each other via one or more loopback ports 228. As a result, instead of needing a top level multilayer or virtual sequencer in order to solve testing data (e.g. transactions, device responses) dependency issues amongst the agents 206, the agents 206 are able to use the loopback ports 228 to send dependency data directly and solve the dependency issues "peer-to-peer." In some embodiments, all of the agents 206 within the environment 204 comprise one or more loopback ports 228. Alternatively, less than all of the agents 206 comprise loopback ports 206. The loopback ports 228 are able to be substantially similar to the other ports within the verification environment 204 except that they are dedicated to coupling two or more agents 206 together within the environment 204.

In some embodiments, some or all of the agents 206 comprise one or more input loopback ports for inputting data (e.g. dependency data) and one or more output loopback ports for outputting data (e.g. dependency data). Alternatively, some or all of the agents 206 are able to comprise only one or more input or only one or more output loopback ports 228. As shown in FIG. 13, a single agent (agent 1) is coupled to a single agent (agent 2) via the loopback ports 228. Alternatively, any of the agents 206 are able to be coupled with zero, one or a plurality of the other agents 206 within the environment 204 wherein the loopback port connections are able to be all outputting data from the agent to the other agents, all inputting data to the agent from the other agents or a combination of input and output connections. Further, although as shown in FIG. 13 the loopback ports of the agents 1 and 2 are coupled via a single connection, a plurality of connections are able to be made between any two agents 206. For example, a first connection is able to send dependency data from agent 1 to agent 2, whereas a second connection is able to send dependency data from agent 2 to agent 1.

This dependency data is able to be data that solves or reflects a dependent or conditional relationship between testing data (e.g. transactions, device responses) sent between the agents 206 and the DUT 212. Two sets or increments of testing data have a dependency relationship if the processing of one of the sets of testing data (with respect to testing the DUT 212) requires data of or related to the other set of testing data such that the dependent testing data cannot be implemented/processed (by the agent 206 and/or DUT 212) until the depended upon testing data has been implemented/processed such that the required dependency data can be determined from the depended upon testing data. An example of such a pair of dependent testing data is a query response pair, wherein the response testing data is dependent on what the query data (i.e. what the query is asking) The dependencies can be based on some or all of the content of the depended upon testing data (e.g. what is the query, end of packet, start of packet, source identifier, destination identifier), the processing of the depended upon testing data (e.g. when was it sent/synchronization data, has it been received at the destination, did it contain an error), data derived from the content of the depended upon data (e.g. what is the size of the depended upon data) and/or other testing data characteristics that are able to be depended upon. In other words, testing data is able to be dependent on other testing data in any case where the processing or manipulation of a first set of testing data requires some or all of the processing or manipulation a second set of testing data.

Similar to the permutations of the connections between the agents 206 via the loopback ports 228, the dependencies between testing data is able to be one to one, one to a plurality and/or mutual dependencies (e.g. multiple dependencies between the same two sets of testing data), wherein the "direction" of the dependencies is able to be all one direction or a combination of directions (e.g. a, b and c dependent on d or d dependent on a, b and c; a and b dependent on d and d dependent on c; a dependent on b and b dependent on a). The dependency data itself that is sent between the agents 206 via the loopback ports 228 is able to comprise the transactions, the device responses and/or portions or derivations thereof. For example, the dependency data for a query/response dependency between two sets of testing data is able to be the query itself, which is sent to the second agent for generating a response to the query. Alternatively, the dependency data for two conditional transactions is able to be a portion of one of the transactions (e.g. start of packet, end of packet, packet identifier, source port, destination port, packet size, or other packet field values) that is used to parse or otherwise process the second of the transactions. Alternatively, the dependency data for two conditional transactions is able to be an indication that one of the transactions has been send to or received by the DUT 212 such that the DUT 212 is ready to receive the second of the transactions. Essentially, the dependency data is able to be any data that solves the unknown or variable in the second of the transactions that created/caused the dependency between the testing data.

In operation, if an agent 206 is coupled with one or more other agents 206 via the loopback ports 228 for outputting dependency data to the other agents 206, the monitor 216 is able to be configured to automatically output sampled testing data (e.g. device response from the DUT 212) to the other agents 206 via the output loopback port 228 coupled to the other agents 206. Alternatively or in addition, if an agent 206 is coupled with one or more other agents 206 via the loopback ports 228 for outputting dependency data to the other agents 206, the sequencer 214 is able to be configured to automatically output generated testing data (e.g. a transaction for the DUT 212) to the other agents 206 via the output loopback port 228 coupled to the other agents 206. Alternatively or in addition, if an agent 206 is coupled with one or more other agents 206 via the loopback ports 228 for inputting dependency data to from other agents 206, the sequencer 214 is able to be configured to automatically input or poll the loopback ports 228 for the dependency data from the loopback ports 228 of the other agents 206 and to adjust or generate testing data to be output to the DUT 212 (via the driver 220) based on the input dependency data.

Figure 5:
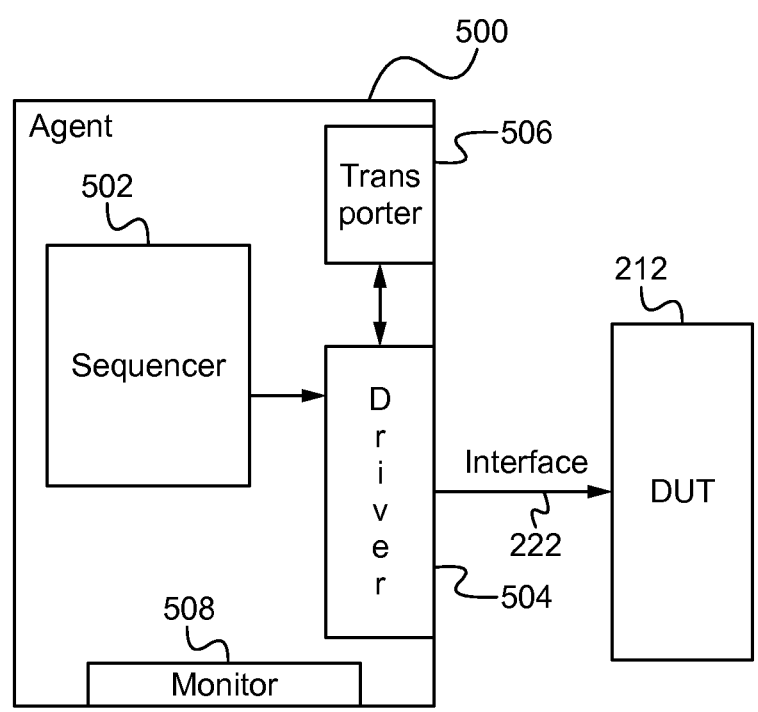
FIG. 5 illustrates an agent according to some embodiments.
Figure 8:
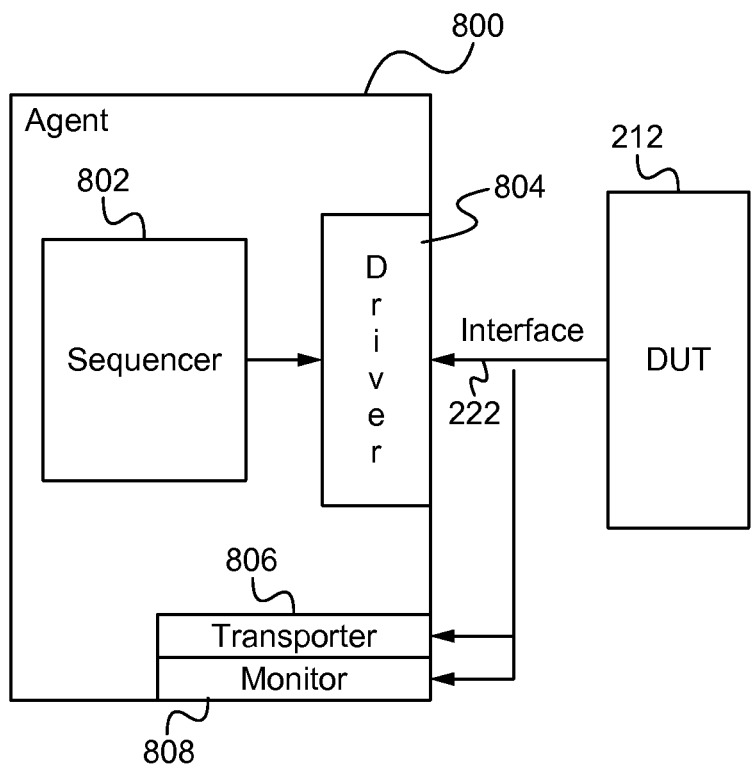
FIG. 8 illustrates an agent according to some embodiments.

In some embodiments, the inputting or outputting of dependency data by the monitor 216 and/or sequencer 214 is able to occur automatically every cycle. Alternatively, it is able to occur automatically or manually every cycle, periodic cycles, based on a trigger event, and/or other cycle schedules. In embodiments wherein the agent 206 comprises a transporter 506/806 as shown in FIGS. 5 and 8, the transporter 506/806 is able to control the outputting and/or inputting of the dependency data in the same manner in which it controls the outputting and/or inputting of the transaction or device response data as described herein. Alternatively, even if a transporter 506/806 is present in the agent 206, the monitor 216 and/or sequencer 214 are able to operate independently with respect to the dependency data and loopback ports 228 as described above. In some embodiments, the dependency data is able to be broadcast or multicast on multiple output loopback ports 228 simultaneously. Alternatively, the dependency data is able to be sent out on a plurality of loopback ports 228 sequentially (e.g. round robin), via a priority scheme and/or upon request.

Figure 14:
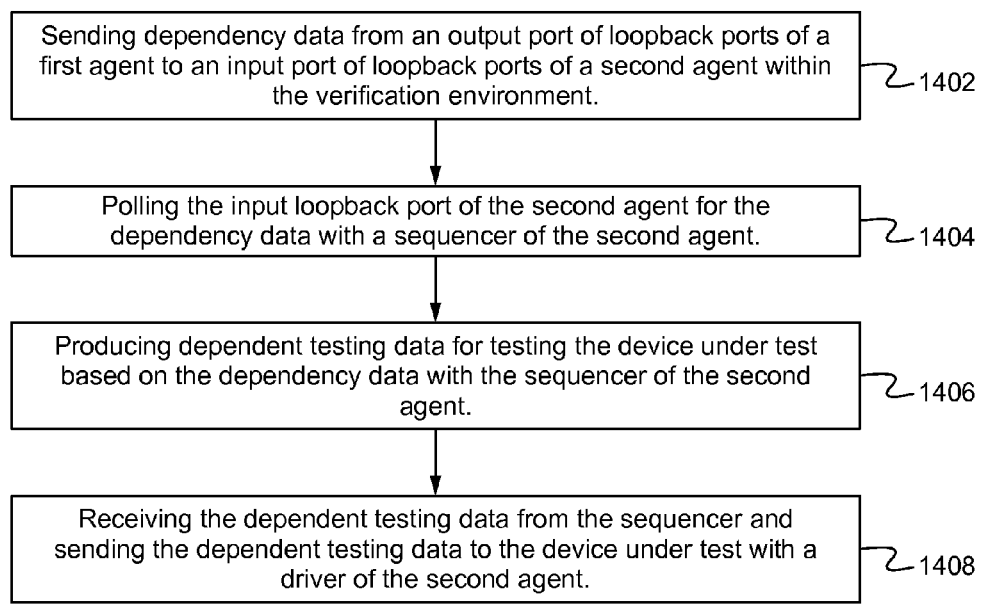
FIG. 14 illustrates a method of testing a device under test within a verification environment of a testbench according to some embodiments.

FIG. 14 illustrates a method of testing a device under test within a verification environment of a testbench according to some embodiments. Although described separately, one or more of the steps of the methods of FIGS. 6, 9, 12, 14 and/or 15 are able to be combined into a single method. For example, a method of operation of the testbench 202 or verification environment 204 as a whole is able to comprise a combination of one or more of the steps of all of the methods of FIGS. 6, 9, 12, 14 and 15 depending on the types of components (e.g. agents, transporters, dispatchers, loopback ports) within the environment 204. As shown in FIG. 14, a first agent 206 (via the monitor 216 and/or sequencer 214) sends dependency data from an output port of its loopback ports 228 to an input port of loopback ports 228 of one or more second agents 206 within the verification environment 204 at the step 1402. In some embodiments, the sending of the dependency data comprises (simultaneously or otherwise) sending the data to a plurality of input loopback ports 228 of a plurality of agents 206. In some embodiments, the dependency data is related to testing data sampled by the monitor 216 (e.g. a device response/query) from the interface 222 between the first agent 206 and the DUT 212. For example, in some embodiments the method further comprises the monitor 216 of the first agent 206 inputting testing data (e.g. a sampled device response) from the DUT 212 such that the dependency data of step 1402 is based on the input testing data. Indeed, in some embodiments the dependency data is able to match the testing data sampled by the monitor 216. Additionally, in some embodiments this exemplary operation of the monitor 216 is able to be controlled by a transporter 806 of the first agent 206 as described in the method of FIG. 9.

Alternatively, the dependency data is able to be related testing data generated by the sequencer 214 (e.g. a new transaction) and sent to the DUT 212 via the interface 222 between the first agent 206 and the DUT 212. For example, in some embodiments the method further comprises the sequencer 214 of the first agent 206 generating new testing data (e.g. the new transaction) for testing the DUT 212 and the driver 220 of the first agent 206 receives the testing data from the sequencer 214 and sends it to the DUT 212 such that the dependency data of step 1402 is based on the new testing data. Further, this new testing data is able to be independent testing data or testing data that was dependent on a different set of testing data from a different agent 206. Moreover, in some embodiments this exemplary operation of the sequencer 214 and driver 220 is able to be controlled by a transporter 506 of the first agent 206 as described in the method of FIG. 6. The sequencer 214 of the second agent(s) 206 polls the input port 228 for the dependency data at the step 1404. The sequencer 214 of the second agent(s) 206 produce or generate dependent testing data (e.g. a new transaction) for testing the DUT 212 based on the dependency data at the step 1406. The driver 220 of the second agent(s) 206 receive the dependent testing data from the sequencer 214 and send the dependent testing data to the DUT 212 at the step 1408. In particular, in some embodiments a sequence that creates/builds transactions is able to be registered in the sequencer 214 such that the sequencer 214 is able to execute the sequence and thereby generate the transactions. In such embodiments, the polling of the dependency data and/or producing of dependent testing data is able to be in the sequence registered in the sequencer 214.

In some embodiments, the method further comprises the first agent 206 receiving dependency data from one or more other agents 206 in the same manner that the second agent(s) 206 received such data from the first agent 206. Indeed, the dependency data sent by the first agent 206 is able to be based on dependency data received by the first agent 206 from a different agent 206 via the loopback ports 228. Further, in some embodiments, one or more of the second agent(s) 206 send dependency data to the first agent 206 either before or after the first agent 206 sends its dependency data. Accordingly, the method provides the advantage of enabling dependency issues that arise during the testing of the DUT 212 to be solved on a peer to peer level between the agents 206 via the loopback ports 228 and their connections removing the need for a top level virtual or multi-layer sequencer to be generated in the virtual environment 204.

In some embodiments, the monitor 216 of one or more of the agents 206 is configured to determine a timestamp value for testing data (e.g. transactions) sampled by the monitor 216, wherein the timestamp value indicates the time when the testing data was sampled from the interface 222 by the monitor. As a result, this timestamp value for the testing data is able to be referenced by any of the agents 206 and/or other components (e.g. scoreboard, reference module, dispatcher) of the verification environment 204 in order to determine the latency of the testing data in reaching the agents 206 and/or components. Specifically, in such embodiments the agents 206 and/or other components are able to read the timestamp value and compare it to the current time in order to determine the amount of time (e.g. latency value) that elapsed between when the testing data was sampled and when it reached the agents 206 and/or other components (i.e. the verification environment latency for the testing data). The agents 206 and/or other components are then able to adjust the timing of their actions based on this latency value. These actions are able to comprise the generation and/or driving of testing data to the DUT 212, the initiation of handshake protocol with the DUT 212, the generation and/or transmission of dependency data to one or more different agents 206 via loopback ports 228, and/or any other operations performed by the agents 206 and/or the other components of the verification environment 204.

For example, if a first agent 206 is configured to receive a query from the DUT 212 and a second agent is configured to send a response to the DUT 212 for the query after a predetermined time period (e.g. 15-25 clock cycles), the monitor 216 of the first agent is able to determine the timestamp value of the query. Then, when the second agent receives the query it is able to determine the latency value of the query based on the timestamp value and the time it was received. Finally, the second agent 206 is able to determine how much more time must pass (if any) before the predetermined time period has elapsed by subtracting the latency value from the predetermined time period such that the second agent 206 is able to ensure that the response to the query is sent to the DUT 212 at a time when or after the predetermined time period has elapsed. As a result, the timestamps provide the advantage of enabling each agent 206 and/or other component within the verification environment 204 to determine the latency of any testing data that they receive and adjust for that latency if necessary. In particular, this able to be done without the use of a separate component (e.g. a virtual or multilayer sequencer) that must separately control the agents 206 and/or other components in order to adjust for the latency issues.

In some embodiments, the sequencer 214 of one or more of the agents 216 is configured to read the timestamp value, determine the latency value based on the current time and adjust operation based on the latency value. Alternatively, the driver 220, monitor 216, transporter 506 (see FIG. 5), or other element of the agents 206 is able to read the timestamp value, determine the latency value based on the current time and adjust operation based on the latency value. In some embodiments, the timestamp value is added to a header of the testing data such that subsequent agents 206 and/or the DUT 212 are able to read the header of the testing data in order to determine the timestamp value. Alternatively or in addition, the timestamp value is able to be stored and/or transmitted separately from the testing data to which it relates. For example, the timestamp value is able to be added to the dependency data related to the testing data such that the value is able to be accessed from the dependency data.

Figure 15:
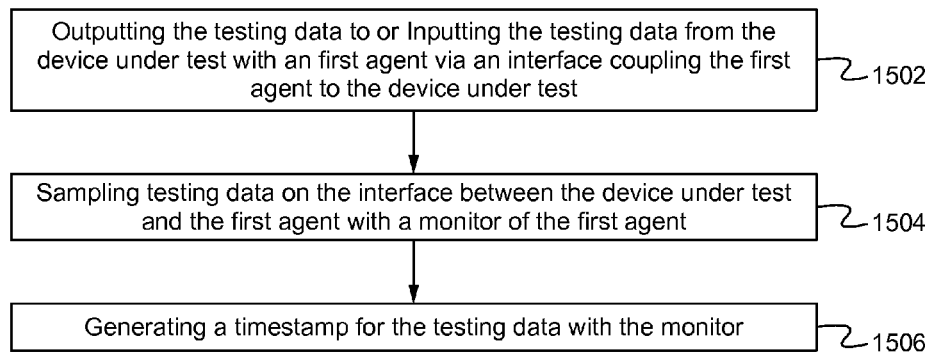
FIG. 15 illustrates a method of testing a device under test within a verification environment of a testbench according to some embodiments.

FIG. 15 illustrates a method of testing a device under test within a verification environment of a testbench according to some embodiments. Although described separately, one or more of the steps of the methods of FIGS. 6, 9, 12, 14 and/or 15 are able to be combined into a single method. For example, a method of operation of the testbench 202 or verification environment 204 as a whole is able to comprise a combination of one or more of the steps of all of the methods of FIGS. 6, 9, 12, 14 and 15 depending on the types of components (e.g. agents, transporters, dispatchers, loopback ports) within the environment 204. As shown in FIG. 15, a first agent 206 performs one of outputting the testing data to or inputting the testing data from the DUT 212 via the interface 222 coupling the first agent 206 to the DUT 212 at the step 1502. A monitor 216 of the first agent 206 samples testing data on the interface 222 between the DUT 212 and a first agent 206 at the step 1504. The monitor 216 generates a timestamp for the testing data at the step 1506. Specifically, the timestamp is able to indicate a sampled time at which the testing data was sampled by the monitor 216 and thus first becomes active within the verification environment 204.

In some embodiments, the method further comprises receiving sequencer data associated with the testing data with a sequencer 214 of a second agent 206 coupled to the first agent 206 (e.g via loopback ports 228) and comparing the sampled time associated with the testing data with a current time to determine a latency of the received sequencer data. The comparison is able to be performed by the sequencer 214 or any other component of the second agent 206. In some embodiments, the method further comprises generating new testing data with the sequencer 214 based on the received sequencer data and adjusting when a driver 220 of the second agent 206 drives the new testing data to the DUT 212 with the sequencer 214 based on the latency of the received sequencer data. In particular, the adjusting of when the driver 220 drives the new testing data to the DUT 212 is able to comprise driving the new testing data when a time period equal to a predetermined delay value minus the latency value has elapsed. For example, if the sequencer 214 and/or driver 220 are configured to drive testing data to the DUT 212 after a predetermined delay period from when the DUT 212 transmitted testing data (e.g. device response/ query) to the verification environment 204, the sequencer 214 and/or driver 220 are able to take in consideration the latency of the testing data reaching the sequencer 214 and/or driver 220 when calculating the predetermined delay period. In some embodiments, the delay period is between 15 and 25 clock cycles. Alternatively, the delay period is able to be less than 15 clock cycles or greater than 25 clock cycles. Also, in some embodiments the testing data of the second agent 206 is dependent on the testing data of the first agent 206 such that the second agent 206 is unable to output the dependent testing data without first receiving dependency data about the depended upon testing data of the first agent 206. Indeed, in such embodiments the dependency data is the same as the sequencer data. For example, the dependency data is able to be a transaction that was received by the sequencer 214 as the sequencer data.

Testbench Agent

FIG. 5 illustrates an agent 500 according to some embodiments. In particular, the agent 500 is able to be substantially similar to the agent 206 except for the differences described herein. Further, although discussed separately, the agent 500 is able to replace and/or supplement the agents in all of the embodiments described herein. Additionally, although shown separately in FIG. 5, the transporter 506 is able to combined within or a part of the driver 504. As shown in FIG. 5, the agent 500 comprises a sequencer 502, a driver 504, a transporter 506 and a monitor 508, wherein the sequencer 502 and transporter 506 are coupled with the driver 504, and the driver 504 and transporter 506 are coupled with the DUT 212 via an interface 222. The transporter 506 is able to be configured to handle all handshaking protocol necessary for communicating with the DUT 212 over the interface 222 such that the driver 504 is able to be generic in that it is not configured based on the handshake protocol of the interface 222. In particular, by removing the handshaking protocol responsibilities from the driver 504 with the transporter 506, the driver 504 is able to be automatically generated for an interface 222 without any knowledge of the protocols of the interface 222.

In some embodiments, the agent 500, driver 504 and/or transporter 506 are configured to transmit all or a portion of the transaction to the DUT 212 via the interface 222 every clock cycle. Similarly, in some embodiments the transporter 506 is configured to perform the handshaking protocol with the interface 222 and/or DUT 212 every clock cycle before permitting or preventing transmission of the transaction to the DUT 212. Alternatively, the transmission of the transaction and/or performance of the handshaking is able to be performed on a transaction basis, operation basis, periodically, on demand, or according to other types of schedules. In some embodiments, the driver 504 is able to operate without the transporter 506 using a default handshake protocol or no handshake protocol.

Figure 6:
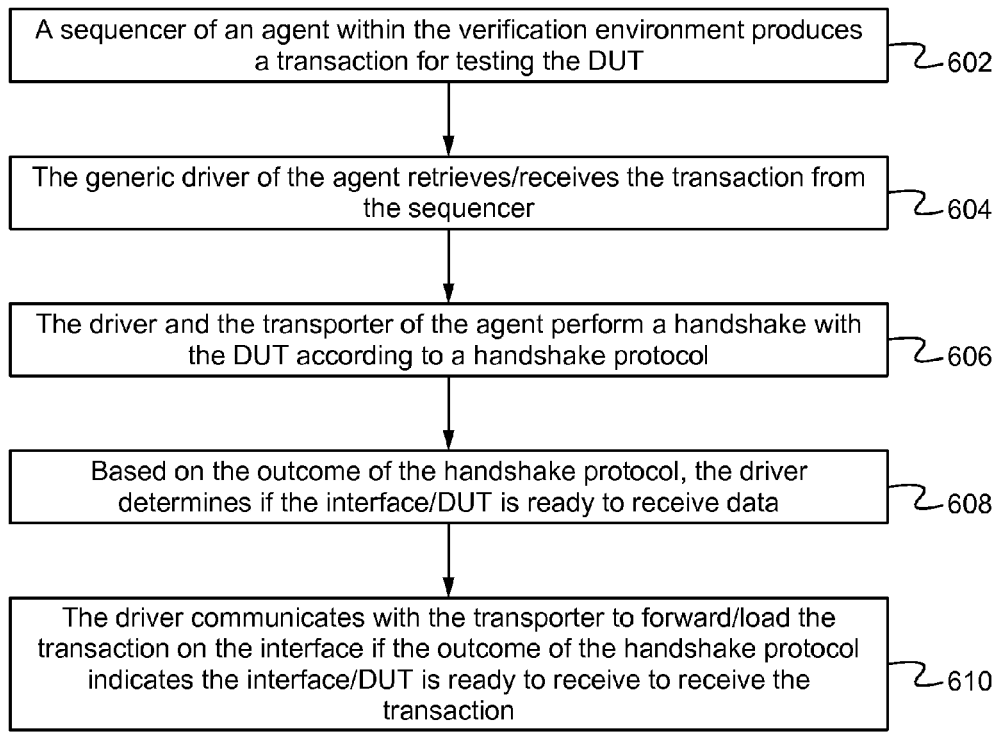
FIG. 6 illustrates a method of testing a device under test within a verification environment of a testbench according to some embodiments.

FIG. 6 illustrates a method of testing a device under test 212 within a verification environment 204 of a testbench 202 according to some embodiments. Although described separately, one or more of the steps of the methods of FIGS. 6, 9, 12, 14 and/or 15 are able to be combined into a single method. As shown in FIG. 6, a sequencer 502 of an agent 500 within the verification environment 204 produces a transaction for testing the DUT 212 at the step 602. The generic driver 504 of the agent 500 retrieves and/or receives the transaction from the sequencer 502 at the step 604. In some embodiments, a new transaction is produced and/or received each clock cycle. Alternatively, one or more of the transactions are able to be multi-cycle such that data related to a single transaction is transmitted and/or received over multiple cycles. The driver 504 and/or the transporter 506 of the agent 500 performs a handshake with the DUT 212 (via the interface 222) according to a handshake protocol at the step 606. In other words, the transporter 506 is able to both drive control signals onto and/or sample control signals from an interface 222 in order to effectuate a handshake protocol for that interface 222 and/or DUT 212. In some embodiments, the handshake protocol used is based on interface 222 and/or DUT 212. In some embodiments, the handshake protocol is indicated by the transporter class for the interface 222 within the interface configuration file. Based on the outcome of the handshake protocol, the driver 504 and/or the transporter 506 determines if the interface 222 and/or DUT 212 is ready to receive data at the step 608. The driver 504 communicates with the transporter 506 to forward/load the transaction on the interface 222 if the outcome of the handshake protocol indicates the interface 222 and/or DUT 212 is ready to receive the transaction at the step 610. In some embodiments, the monitor of the agent 500 also forwards the transaction to the reference model 208 (either directly or via a dispatcher 224) as described above. In some embodiments, the communication is a control command received by the driver 504 from the transporter 506 indicating the outcome of the handshake protocol. In some embodiments, the driver 504 gives the transaction to the transporter 506 based on the outcome such that the transporter 506 forwards and/or loads the transaction on the interface 222.

Alternatively, the driver 504 is able to forward and/or load the transaction on the interface 222 based on the outcome of the handshake protocol. As a result, the method provides the benefit of enabling the driver 504 to remain generic while still customizing the agent 500 for the interface 222 and/or DUT 212 by using the transporter 506 to control the handshake protocol with the interface 222 and/or DUT 212.

In some embodiments, the method further comprises sending data received from the DUT 212 to the one or more additional agents coupled to the agent 500 within the environment 204. In such embodiments, the handshake protocol used by the transporter 506 is able to be different than a handshake protocol of a transporter of the one or more additional agents. As described above, in some embodiments the handshake protocol is one of three handshake protocols consisting of a one-way handshake protocol without destination flow control, a two-way handshake protocol and a one-way handshake protocol with destination flow control. Alternatively, any number and/or combination of different or the same handshake protocols are able to be used. In some embodiments, steps 604-610 are performed each clock cycle. Alternatively, if the transaction is a multi-cycle transaction, step 604 is able to be omitted and only steps 606-610 are performed each subsequent clock cycle until the multi-cycle transaction is complete.

Figure 7A:
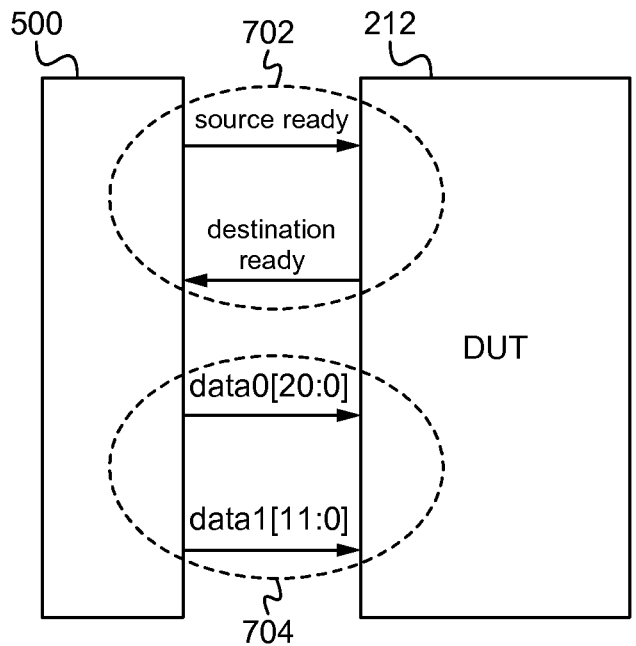
FIG. 7A illustrates a first process including a two-way handshake protocol and transaction transmission according to some embodiments.
Figure 7B:
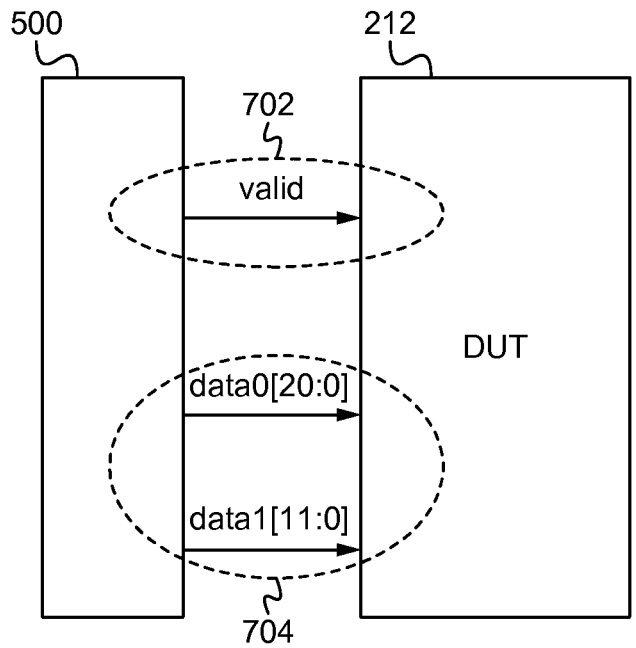
FIG. 7B illustrates a second process including a simple or one-way handshake protocol without flow control and transaction transmission according to some embodiments.
Figure 7C:
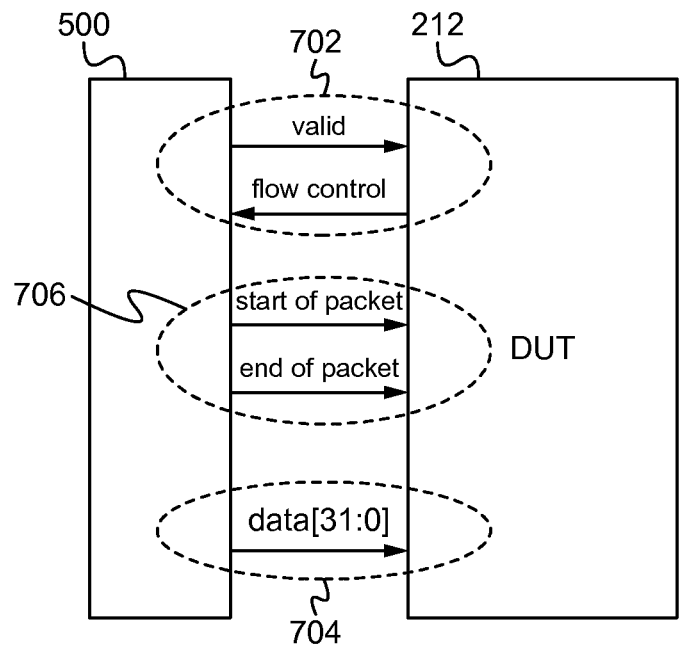
FIG. 7C illustrates a third process including a one-way handshake protocol with flow control, transaction transmission and start/end of data marking signals according to some embodiments.

FIGS. 7A-7C illustrate three exemplary handshake protocol and transaction transfer processes according to some embodiments. FIG. 7A illustrates a first process including a two-way handshake protocol 702 and transaction transmission 704 according to some embodiments. In particular, the two-way handshake protocol 702 comprises sending a first signal "source ready" from the agent 500 to the DUT 212 (via an interface) and sending a second signal "destination ready" from the DUT 212 to the agent 500. According to the handshake protocol 702, the agent 500 indicates that it is ready to send data (and/or that all control and data signals are valid) when it makes "source ready" high and the DUT 212 indicates that it is ready to accept data when "destination ready" is high. As a result, when both "source ready" and "destination ready" are both high, the outcome of the protocol indicates that transaction transmission(s) 704 should be transmitted and when either "source ready" or "destination ready" are low, the outcome of the protocol indicates that transaction transmission(s) 704 should not be transmitted or cease from being transmitted from the agent 500 to the DUT 212. This two-way handshake protocol enables either party (agent 500 or DUT 212) to stop transaction transmissions 704 unilaterally and restricts the beginning of transaction transmissions 704 to when both parties indicate that they are ready. As shown in FIG. 7A, the transaction transmission 704 comprises two datasets (data0 and data1) having a payloads of 20:0 and 11:0. Alternatively, the transaction transmission 704 is able to comprise more or less datasets and/or transmission streams each having more or less payload and/or quantity of data. In some embodiments, the driver 504 transmits the transaction transmission 704 to the DUT 212 based on the outcome of the handshake protocol 702 (as executed by the transporter 506). Alternatively, the transporter 506 is able to retrieve the transaction from the driver 504 and transmit the transaction transmission 704 to the DUT 212 based on the outcome of the handshake protocol 702.

FIG. 7B illustrates a second process including a simple or one-way handshake protocol without flow control 702 and transaction transmission 704 according to some embodiments. In particular, the one-way handshake protocol without flow control 702 comprises sending a first signal "valid" from the agent 500 to the DUT 212 (via an interface). According to the handshake protocol 702, the agent 500 indicates that it is ready to send data when it makes "valid" high (and/or that all control and data signals are valid), but unlike the first process, the agent 500 does not wait for, nor does the DUT 212 send, a signal that indicates that the DUT 212 is ready to accept data. As a result, when "valid" is high, the outcome of the protocol indicates that transaction transmission(s) 704 should be transmitted and when "valid" is low, the outcome of the protocol indicates that transaction transmission(s) 704 should not be transmitted or cease from being transmitted from the agent 500 to the DUT 212. This one-way handshake protocol puts full control in the agent 500 to stop or start transaction transmissions 704 unilaterally, wherein the DUT 212 has no flow control and rather is simply notified by the agent 500 when transaction transmission 704 is incoming. As shown in FIG. 7B, like FIG. 7A, the transaction transmission 704 comprises two datasets data0 and data1) having payloads of 20:0 and 11:0. However, the transaction transmission 704 is able to comprise more or less datasets and/or transmission streams each having more or less payload and/or quantity of data. In some embodiments, the driver 504 transmits the transaction transmission 704 to the DUT 212 based on the outcome of the handshake protocol 702 (as executed by the transporter 506). Alternatively, the transporter 506 is able to retrieve the transaction from the driver 504 and transmit the transaction transmission 704 to the DUT 212 based on the outcome of the handshake protocol 702.

FIG. 7C illustrates a third process including a one-way handshake protocol with flow control 702, transaction transmission 704 and start/end of data marking signals 706 according to some embodiments. In particular, the one-way handshake protocol with flow control 702 comprises sending a first signal "valid" from the agent 500 to the DUT 212 (via an interface). According to the handshake protocol with flow control 702, the agent 500 indicates that it is ready to send data (and/or that all control and data signals are valid) when it makes "valid" high and, like the second process, the agent 500 does not wait for, nor does the DUT 212 send, a signal that indicates that the DUT 212 is ready to accept data. However, unlike the second process, the one-way handshake protocol with flow control 702 enables the DUT 212 to send the signal "flow control" to indicate when the DUT 212 can no longer accept more data. As a result, when "valid" is high and "flow control" is low, the outcome of the protocol indicates that transaction transmission(s) 704 should be transmitted and when "valid" is low or "flow control" is high, the outcome of the protocol indicates that transaction transmission(s) 704 should not be transmitted or cease from being transmitted from the agent 500 to the DUT 212. This one-way handshake protocol with flow control puts control in the agent 500 over the start of transaction transmissions 704 unilaterally, but gives the DUT 212 the ability to stop the transaction transmissions 704 using the flow control signal "flow control". For multi-cycle transactions, in some embodiments the first signal portion of the third process is only performed in the first cycle such that subsequent cycles of the multi-cycle transaction comprise repeating the checking for the "flow control" going high in order to indicate that any further data is invalid. Alternatively, even for multi-cycle transactions the first signal portion is able to be repeated along with the "flow control" checking each cycle of the transaction until the multi-cycle transaction is complete.

Further, as shown in FIG. 7C, the third process is able to comprise start/end of data marking signals 706. These signals 706 are able to comprise a start of packet (sop) signal and an end of packet (eop) signal that indicate the first data cycle and the last data cycle of the packet (of the transaction transmission 704), respectively. As a result, the start/end of data marking signals 706 are able to be used with larger packets and/or transaction transmissions 704 in order to indicate to the DUT 212 when each packet (or transaction 704) starts and/or stops. For example, if the agent 500 is sending data at the rate of 32 bits per clock cycle, but the packets and/or chunks are greater than 32 bits of data (e.g. 64 or 128 bytes/chunks), the start/end of data marking signals 706 are able to be used to mark the end and the beginning of the packets and/or chunks. Alternatively, the start/end of data marking signals 706 are able to be omitted from the third process. Additionally, it should be noted that the start/end of data marking signals 706 are able to be added to the first, second and/or any other handshake processes described herein as desired to deal with longer transaction transmissions 704. Additionally, as shown in FIG. 7C, the transaction transmission 704 comprises one dataset (data) having a payload of 31:0. However, similar to above, the transaction transmission 704 is able to comprise more or less datasets and/or transmission streams each having more or less payload and/or quantity of data. In some embodiments, the driver 504 transmits the transaction transmission 704 to the DUT 212 based on the outcome of the handshake protocol 702 (as executed by the transporter 506). Alternatively, the transporter 506 is able to retrieve the transaction from the driver 504 and transmit the transaction transmission 704 to the DUT 212 based on the outcome of the handshake protocol 702. Additionally, although FIGS. 7A-7C illustrate the above described three handshake protocol types, it is understood that other types of handshake protocols are able to be used such a three-way handshakes with or without flow control or data marking and other types of handshake protocols as known in the art.

FIG. 8 illustrates an agent 800 according to some embodiments. In particular, the agent 800 is able to be substantially similar to the agents 206 and/or 500 except for the differences described herein. Further, although discussed separately, the agent 800 is able to replace and/or supplement the agents in all of the embodiments described herein. As shown in FIG. 8, the agent 800 comprises a sequencer 802, a driver 804, a transporter 806 and a monitor 808, wherein the sequencer 802 is coupled with the driver 804, the transporter 806 is coupled with the monitor 808, and the monitor 808 and transporter 806 are coupled with the DUT 212 and/or the interface 222. The transporter 806 is able to be configured to handle all handshaking protocol necessary for communicating with the DUT 212 over the interface 222 such that the monitor 808 is able to be generic in that it is not configured based on the handshake protocol of the interface 222. In particular, by removing the handshaking protocol responsibilities from the monitor 808 with the transporter 806, the monitor 808 is able to be automatically generated for an interface 222 without any knowledge of the protocols of the interface 222.

In some embodiments, the monitor 808 and/or transporter 806 are configured to monitor and/or sample all or a portion of the transaction on the interface 222 every clock cycle. In such embodiments, the transporter 806 is able to indicate to the monitor 808 whether the sampled/monitored data or transaction is valid based on the outcome of the handshake protocol such that the monitor knows whether to send the sampled/monitored data to a scoreboard 210 or reference model 208 within the environment 204. Alternatively, the monitor 808 is able to be configured to only sample all or a portion of the transaction on the interface 222 during clock cycle where the transporter 806 indicates that the data or transaction is valid based on the outcome of the handshake protocol. In some embodiments the transporter 806 is configured to perform the handshaking protocol with the interface 222 and/or DUT 212 every clock cycle. Alternatively, the performance of the handshaking is able to be performed on a transaction basis, operation basis, periodically, on demand, or according to other types of schedules. In some embodiments, the monitor 808 is able to operate without the transporter 506 using a default handshake protocol or no handshake protocol to determine if data is valid.

In some embodiments, the agents 500 and 800 are able to be combined such that the combined agent comprises both a generic driver 504 and a generic monitor 808. In such embodiments, the driver 504 and monitor 808 are able to share the same the transporter 506/806, which is coupled with both the driver 504 and monitor 808. As a result, in such embodiments the transporter 506/806 is able to control both the driver 504 and the monitor 808 based on the outcome of the handshake protocol as described herein. Alternatively, in such embodiments the driver 504 and the monitor 808 are able to have separate transporters 506/806 that are separately coupled to the monitor 808 or the driver 504 and operate as described herein separately.

Figure 9:
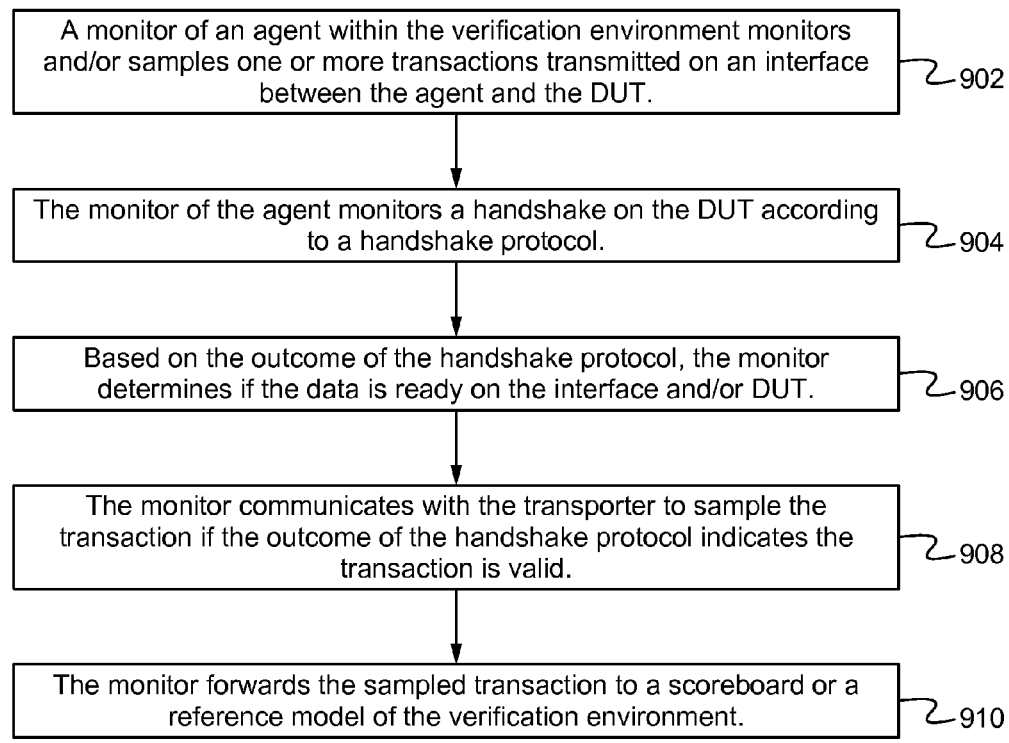
FIG. 9 illustrates a method of testing a device under test within a verification environment of a testbench according to some embodiments.

FIG. 9 illustrates a method of testing a device under test 212 within a verification environment 204 of a testbench 202 according to some embodiments. Although described separately, one or more of the steps of the methods of FIGS. 6, 9, 12, 14 and/or 15 are able to be combined into a single method. As shown in FIG. 9, a monitor 808 of an agent 800 within the verification environment 204 monitors and/or samples one or more transactions transmitted on an interface 222 between the agent 800 and the DUT 212 at the step 902. In some embodiments, a new transaction is monitored and/or sampled each clock cycle. Alternatively, one or more of the transactions are able to be multi-cycle such that data related to a single transaction is monitored and/or sampled over multiple cycles. The monitor 808 of the agent 800 monitors a handshake on the DUT 212 according to a handshake protocol at the step 904. Specifically, the transporter 806 and/or driver 804 of the agent 800 are able to perform the handshake with the DUT 212 (via the interface 222) according to the handshake protocol which is monitored by the monitor 808. In other words, the transporter 806 is able to both drive control signals onto and/or sample control signals from an interface 222 in order to effectuate a handshake protocol for that interface 222 and/or DUT 212. In some embodiments, the handshake protocol used is based on interface 222 and/or DUT 212. In some embodiments, the handshake protocol is indicated by the transporter class for the interface 222 within the interface configuration file.

Based on the outcome of the handshake protocol, the monitor 808 determines if the data is ready on the interface 222 and/or DUT 212 at the step 906. The monitor 808 communicates with the transporter 806 to sample the transaction if the outcome of the handshake protocol indicates the transaction is valid at the step 908. The monitor 808 forwards the sampled transaction to a scoreboard 210 or a reference model 208 of the verification environment 204 at the step 910. In other words, the transporter 806 is able to indicate to the monitor 808 whether the transaction or portion of the transaction on the interface 222 should be sampled and forwarded to the scoreboard 210 or reference model 208 because the outcome of the handshake protocol indicates that the transaction is valid or invalid for the cycle or cycles. In some embodiments, the communication is a control command received by the monitor 808 from the transporter 806 indicating the outcome of the handshake protocol. In some embodiments, the monitor 808 discards or fails to forward the transaction to the scoreboard 210 or the reference model 208 if the outcome of the handshake protocol indicates the transaction is invalid. As a result, the method provides the benefit of enabling the monitor 808 to remain generic while still customizing the agent 800 for the interface 222 and/or DUT 212 by using the transporter 806 to control the handshake protocol with the interface 222 and/or DUT 212.

In some embodiments, the method further comprises sending data received from the DUT 212 to the one or more additional agents coupled to the agent 800 within the environment 204. In such embodiments, the handshake protocol used by the transporter 806 is able to be different than a handshake protocol of a transporter of the one or more additional agents. As described above, in some embodiments the handshake protocol is one of three handshake protocols consisting of a one-way handshake protocol without destination flow control, a two-way handshake protocol and a one-way handshake protocol with destination flow control. Alternatively, any number and/or combination of different or the same handshake protocols are able to be used. In some embodiments, the handshake protocol and/or sampling and forwarding based on the outcome of the handshake protocol is able to be performed each clock cycle. In addition, if the transaction is a multi-cycle transaction, the sampling and/or forwarding is able to continue through multiple consecutive clock cycles until the multi-cycle transaction is complete (e.g. based on the end of packet or start of packet indicators). In such multi-cycle embodiments, the handshake protocol is able to still be repeated each cycle to verify that the transaction is still valid or has become invalid.

Figure 10A:
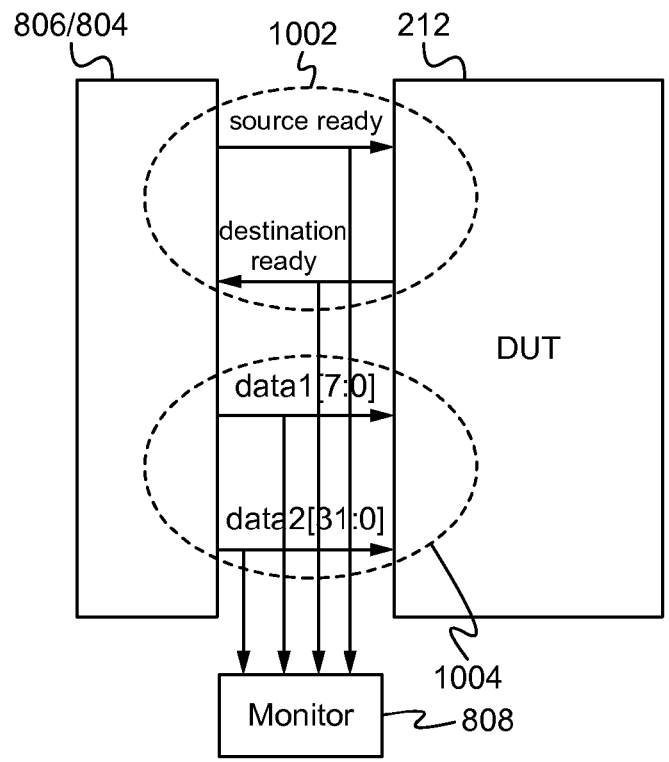
FIG. 10A illustrates a first process of monitoring a two-way handshake protocol and transaction transmission according to some embodiments.
Figure 10B:
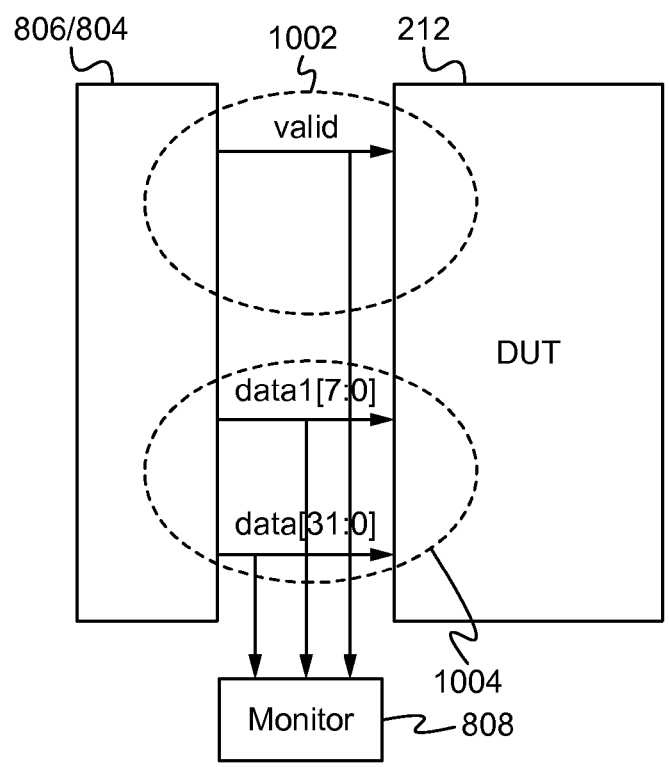
FIG. 10B illustrates a second process of monitoring a simple or one-way handshake protocol without flow control and transaction transmission according to some embodiments.
Figure 10C:
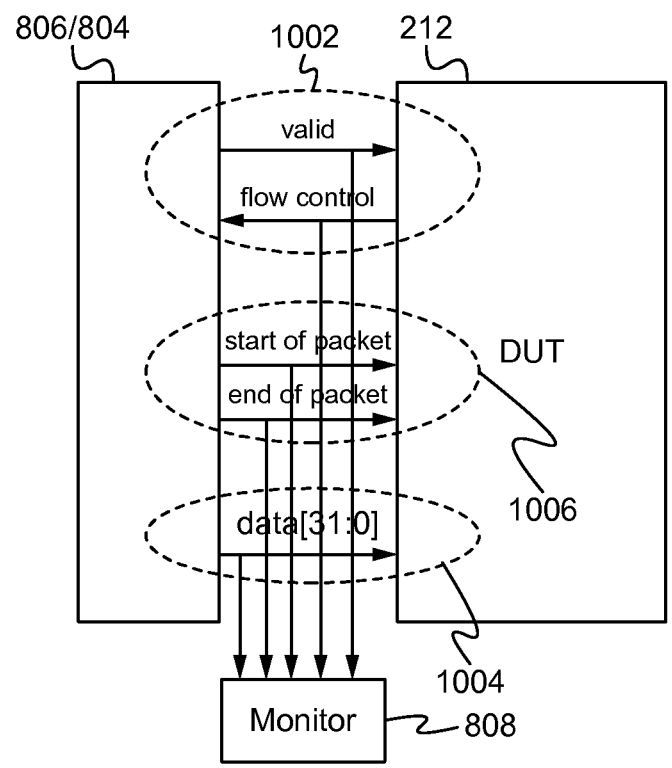
FIG. 10C illustrates a third process of monitoring a one-way handshake protocol with flow control, transaction transmission and start/end of data marking signals according to some embodiments.

FIGS. 10A-10C illustrate three exemplary handshake protocol and transaction transfer processes according to some embodiments. The three handshake protocol and transaction transfer processes of FIGS. 10A-10C are substantially similar to those described in FIGS. 7A-7C except for the differences described herein. FIG. 10A illustrates a first process of monitoring a two-way handshake protocol 1002 and transaction transmission 1004 according to some embodiments. In particular, the two-way handshake protocol 1002 comprises sending a first signal "source ready" from the driver 804 and/or transporter 806 to the DUT 212 (via an interface) and sending a second signal "destination ready" from the DUT 212 to the driver 804 and/or transporter 806. According to the handshake protocol 1002, the driver 804 and/or transporter 806 indicates that it is ready to send data (and/or that all control and data signals are valid) when it makes "source ready" high and the DUT 212 indicates that it is ready to accept data when "destination ready" is high. As a result, when both "source ready" and "destination ready" are both high, the outcome of the protocol indicates that transaction transmission(s) 1004 are valid (e.g. for sampling) and when either "source ready" or "destination ready" are low, the outcome of the protocol indicates that transaction transmission(s) 1004 are invalid (e.g. do not need to be sampled or forwarded). This two-way handshake protocol enables either party (driver 804/transporter 806 or DUT 212) to stop transaction transmissions 1004 unilaterally and restricts the beginning of transaction transmissions 1004 to when both parties indicate that they are ready. As shown in FIG. 10A, the transaction transmission 1004 comprises two datasets (data1 and data2) having payloads of 7:0 and 31:0. Alternatively, the transaction transmission 1004 is able to comprise more or less datasets and/or transmission streams each having more or less payload and/or quantity of data. Based on the outcome of the handshake protocol 1002 (as received from the transporter 806), the monitor 808 is able to sample the datasets of the transaction 1004 for forwarding to the reference model 208 or the scoreboard 210. In other words, the monitor 808 is able to determine when the datasets transmitted on the interface 222 are valid datasets (e.g. when "source ready" and "destination ready" are high) that need to be sampled and forwarded to the desired component based on the outcome of the handshake protocol as indicated by the transporter 806.

FIG. 10B illustrates a second process of monitoring a simple or one-way handshake protocol without flow control 1002 and transaction transmission 1004 according to some embodiments. In particular, the one-way handshake protocol without flow control 1002 comprises sending a first signal "valid" from the driver 804 and/or transporter 806 to the DUT 212 (via an interface). According to the handshake protocol 1002, the driver 804 and/or transporter 806 indicates that it is ready to send data when it makes "valid" high (and/or that all control and data signals are valid), but unlike the first process, the driver 804 and/or transporter 806 do not wait for, nor does the DUT 212 send, a signal that indicates that the DUT 212 is ready to accept data. As a result, when "valid" is high, the outcome of the protocol indicates that transaction transmission(s) 1004 are valid (e.g. for sampling) and when "valid" is low, the outcome of the protocol indicates that transaction transmission(s) 1004 are invalid (e.g. do not need to be sampled or forwarded). This one-way handshake protocol puts full control in the driver 804 and/or transporter 806 to stop or start transaction transmissions 1004 unilaterally, wherein the DUT 212 has no flow control and rather is simply notified by the driver 804 and/or transporter 806 when transaction transmission 1004 is incoming. As shown in FIG. 10B, like FIG. 10A, the transaction transmission 1004 comprises two datasets (data and data1) having payloads of 7:0 and 31:0. However, the transaction transmission 1004 is able to comprise more or less datasets and/or transmission streams each having more or less payload and/or quantity of data. Based on the outcome of the handshake protocol 1002 (as received from the transporter 806), the monitor 808 is able to sample the datasets of the transaction 1004 for forwarding to the reference model 208 or the scoreboard 210. In other words, the monitor 808 is able to determine when the datasets transmitted on the interface 222 are valid datasets (e.g. when "valid" is high) that need to be sampled and forwarded to the desired component based on the outcome of the handshake protocol as indicated by the transporter 806.

FIG. 10C illustrates a third process of monitoring a one-way handshake protocol with flow control 1002, transaction transmission 1004 and start/end of data marking signals 1006 according to some embodiments. In particular, the one-way handshake protocol with flow control 1002 comprises sending a first signal "valid" from the driver 804 and/or transporter 806 to the DUT 212 (via an interface). According to the handshake protocol with flow control 1002, the driver 804 and/or transporter 806 indicates that it is ready to send data (and/or that all control and data signals are valid) when it makes "valid" high and, like the second process, the driver 804 and/or transporter 806 does not wait for, nor does the DUT 212 send, a signal that indicates that the DUT 212 is ready to accept data. However, unlike the second process, the one-way handshake protocol with flow control 1002 enables the DUT 212 to send the signal "flow control" to indicate when the DUT 212 can no longer accept more data. As a result, when "valid" is high and "flow control" is low, the outcome of the protocol indicates that transaction transmission(s) 1004 are valid (e.g. for sampling) and when "valid" is low or "flow control" is high, the outcome of the protocol indicates that transaction transmission(s) 1004 are invalid (e.g. do not need to be sampled or forwarded). This one-way handshake protocol with flow control puts control in the driver 804 and/or transporter 806 over the start of transaction transmissions 1004 unilaterally, but gives the DUT 212 the ability to stop the transaction transmissions 1004 using the flow control signal "flow control". For multi-cycle transactions, in some embodiments the first signal portion of the third process is only performed in the first cycle such that subsequent cycles of the multi-cycle transaction comprise repeating the checking for the "flow control" going high in order to indicate that any further data is invalid. Alternatively, even for multi-cycle transactions the first signal portion is able to be repeated along with the "flow control" checking each cycle of the transaction until the multi-cycle transaction is complete.

Further, as shown in FIG. 10C, the third process is able to comprise start/end of data marking signals 1006. These signals 1006 are able to comprise a start of packet (sop) signal and an end of packet (eop) signal that indicate the first data cycle and the last data cycle of the packet (of the transaction transmission 1004), respectively. As a result, the start/end of data marking signals 1006 are able to be used with larger packets and/or transaction transmissions 1004 in order to indicate to the DUT 212 when each packet (or transaction 1004) starts and/or stops. For example, if the driver 804 and/or transporter 806 is sending data at the rate of 32 bits per clock cycle, but the packets and/or chunks are greater than 32 bits of data (e.g. 64 or 128 bytes/chunks), the start/end of data marking signals 1006 are able to be used to mark the end and the beginning of the packets and/or chunks. Alternatively, the start/end of data marking signals 1006 are able to be omitted from the third process. Additionally, it should be noted that the start/end of data marking signals 1006 are able to be added to the first, second and/or any other handshake processes described herein as desired to deal with longer transaction transmissions 1004. Additionally, as shown in FIG. 10C, the transaction transmission 1004 comprises one dataset (data) having a payload of 31:0. However, similar to above, the transaction transmission 1004 is able to comprise more or less datasets and/or transmission streams each having more or less payload and/or quantity of data.

Based on the outcome of the handshake protocol 1002 (as received from the transporter 806), the monitor 808 is able to sample the datasets of the transaction 1004 for forwarding to the reference model 208 or the scoreboard 210. Further, the monitor 808 is able to base the beginning and end of its sampling and/or forwarding on the start/end of packets and/or transactions 1004 based on the data marking signals 1006. In some embodiments, the marking signals 1006 are directly received and determined by the monitor 808 from the interface 222. Alternatively, the marking signals 1006 are able to be determined based on the command signal from the transporter 806 and/or forwarding of the marking signals 1006 from the transporter 806 to the monitor 808. In any case, the monitor 808 is able to determine when the datasets transmitted on the interface 222 are valid datasets (e.g. when "valid" is high and/or the data is between the sop and eop) that need to be sampled and forwarded to the desired component based on the outcome of the handshake protocol as indicated by the transporter 806. Additionally, it should be noted that although FIGS. 10A-10C illustrate the above described three handshake protocol types, it is understood that other types of handshake protocols are able to be used such a three-way handshakes with or without flow control or data marking and other types of handshake protocols as known in the art. Further, for each of the processes, the size of the data sampled (e.g. 32 bits) is able to be determined by the monitor 808 based on the marking signals 1006, indications from the transporter 806, a default number, or a combination thereof.

Testbench Builder Application

The testbench application is able to comprise an input module, an agent generation module, an interconnection module, a test case module and user interface for interacting with the application. The input module is configured to input interface data (e.g. an interface file) that describes the interfaces 222 associated with the DUT 212 for testing the DUT 212. For example, a single interface file is able to be input by the input module, wherein all of the agents are able to be generated and if necessary customized based on the single interface file such that each interface associated with the DUT 212 is described in the interface file. In some embodiments, the interface data is able to comprise an extensible markup language (XML) file. Alternatively, the interface data is able to comprise other types of file formats. In some embodiments, the input module enables a user to manually input interface data. Alternatively or in addition, the input module is able to automatically generate interface data based on an input DUT data. For example, based on the inputs, outputs and protocols associated with the DUT 212, the input module is able to determine a necessary number of interfaces, type of interfaces (input, output, both), protocol and/or transaction format associated with each interface, and or other information about each of the interfaces that are necessary for testing the DUT 212. The interface data is able to comprise one or more of a number of needed interfaces, a name of all the ports in the interface, a width of each port (e.g. number of bits), whether each port is a control or data port, a direction of the port (e.g. input or output) with respect to the DUT 212, a transaction class of each of the interfaces and/or a transporter class of each of the interfaces. Alternatively, the interface data is able to omit the transporter class and/or transaction class of one or more of the interfaces, which indicates that the interface has a default transporter and/or transaction class.

The transaction class is able to indicate what types of data stimulus or transactions that the interface 222 and/or DUT 212 is able to understand. In other words, the transaction class is a representation of the DUT interface in a higher level of abstraction. As a result, the sequencer 214 of the agent 206 associated with the interface 222 is able to utilize stimulus data that is of the indicated transaction class for the interface 222 in the interface data. The transporter class is able to indicate what communication protocol or format (e.g. handshake) that the interface 222 and/or DUT 212 require for communication. For example, the transporter class is able to be one of a two-way handshake, delayed or destination flow control (DFC), one-way handshake (no flow control), or other types of communication protocol as are known in the art. In some embodiments, the default transporter class is a two-way handshake such that the generic agents 206 will be automatically configured to use the two-way handshake communication protocol. Alternatively, a different one of the transporter classes are able to be assigned as the default class that each non-customized agent utilizes. The transporter class is able to determine which of the handshake protocols that the transporter 506 of an agent 500 is configured to use for the associated interface 222.

The agent generation module is configured to generate each agent 206 necessary for the DUT 212 based on interfaces 222 indicated in interface data input by the input module. Specifically, the agent generation module generates a generic or default agent 206 for each of the interfaces 222 indicated in the interface data inputted by the input module. These generic agents 206 are able to each comprise a driver, a sequencer and a monitor that are configured to use a default protocol and default transaction class. In some embodiments, the generic driver of the agents 206 is substantially similar to the generic driver 504 such that it does not handle any handshake protocol between the agent 206 and the interface 222. If necessary based on the interface data, the agent generation module is then able to customize the generic agents based on the interface data of the interface associated with each generic agent. For example, the agent generation module is able to determine the transaction and/or transporter class for the interface 222 and configure the sequencer 214 to operate based on the transaction class and/or configure the driver 220 and monitor 216 to operate based on the transporter class. Additionally, in some embodiments the customization comprises creating a transporter 506 configured to use the handshake protocol associated with the transporter class and thereby operate with the driver 504 as described above with reference to FIG. 5. As a result, each of the agents 206 are able to be automatically generated for and customized based on each interface 222 necessary to test the DUT 212. In other words, the agents 206 that do not need to be customized are generated and immediately ready to operate based on the default transaction and transporter types and the agents 206 that do need to be modified are able to be simply reset to a non-default transaction and/or transporter class and then are ready to operate with the associated interfaces 222. For example, a non-customized agent 206 is able to utilize a driver 504 that operates without or independent of a transporter 506 and does not utilize a handshake protocol or uses a default handshake protocol.

In some embodiments, the agent generation module is able to sort all types of interfaces 222 into one of the three transporter classes or handshake protocols such that the set of transporter classes is able to only include the three handshake protocols regardless of the number of different types of interfaces 222 required for the DUT 212. In some embodiments, the agent generation module generates the generic agents 206 for all of the interfaces 222 and then customizes one or more of the agents 206 as necessary based on the associated interface 222. Alternatively, the agent generation module is able to generate a generic agent 206 and customize the generic agent 206 if necessary based on the associated interface 222 before generating the next generic agent 206 for the next interface 222. In some embodiments, the agent generation module instantiates the agents 206 within the environment 204 after all the agents 206 have been generated and/or customized. Alternatively, the agent generation module instantiates each of the agents 206 within the environment 204 after the agent 206 has been generated and/or customized. In some embodiments, the agent generation module is able to dynamically change the transaction and/or transporter class of one or more agents 206 within the verification environment 204 without creating a new testbench 202. For example, a user is able to enter commands to add, subtract and/or modify one or more of the agents 206 using the user interface and the agent generation module is able to implement the changes to the agents 206 within the environment 204 automatically. As a result, the testbench builder application provides the benefit of automatically creating generic and customized agents 206 for each interface 222 necessary to test a DUT 212.

The interconnection module is configured to generate a verification environment 204 for the testbench 202. Specifically, the interconnection module generates a reference model 208 and a scoreboard 210 and integrates and instantiates the reference model 208, the scoreboard 210, the ports, the interfaces 222 and all of the agents 206 into the verification environment 204. Further, this integration is able to comprise establishing interconnections between the reference model 208, the scoreboard 210, the agents 206, DUT 212 and the interfaces 222 via the ports (e.g. RTL ports). In particular, the interconnection module is able to couple the ports of the DUT 212 with the interfaces 222. For example, if one or more of the agents 206 comprise loopback ports, the interconnection module is able to couple one or more of the agents 206 together via the loopback ports. As described above, this loopback port coupling is able to be based on the dependency of the testing data associated with each of the agents 206 with respect to testing the DUT 212. In particular, the interconnection module is able to automatically couple the loopback ports of any combination of agents 206 whose testing data has a dependency relationship such that via the loopback connections all the agents 206 with the depended upon testing data send the associated dependency data to all the agents 206 with testing data that is dependent on the depended upon testing data. Indeed, in some embodiments the dependent relationships of the agents 206 is able to be automatically determined based on the interface parameters such that the loopback port coupling is able to be automatically performed by the interconnection module based on the interface configuration file. The interconnection module is also able to register each of the interfaces 222 in a configuration database with a unique string or other identifier such that each interface 222 is able to be used by one or more components (e.g. agents, scoreboard, monitor) within the environment 204 via a string or unique identifier based lookup in the configuration database. Moreover, in some embodiments the interconnection module is able to bind the output/input of one or more of the agents 206 to one or more other agents 206 within the environment 204.

The test case module is configured to generate one or more random or predefined test cases for generating stimulus data for testing the DUT 212 with the testbench 202. For example, the test case module is able to generate a sample test based on the DUT 212 and/or interface data for testing the DUT 212 once the testbench 202 has been generated. The user interface is configured to provide users a graphical user interface for issuing commands to the testbench 202 and/or the testbench builder application. For example, a user is able to specify a test case based on which stimulus data is used to test the DUT 212, a user is able to adjust the reference module 208 operation in order to reflect changes in the desired operation, and/or a user is able to add, subtract and/or modify one or more of the agents 206 via the transaction and/or transporter class values as desired. In particular, as described above, the testbench builder application is able to dynamically change the testbench 202 and/or verification environment 204 (without creating a whole new testbench) based on such commands received from the user interface. It should also be noted that the testbench builder application is also able to dynamically change the testbench 202 and/or verification environment 204 (without creating a whole new testbench) based on changed interface data received by the input module. In either case, the testbench builder application provides the benefit of being able to dynamically change a testbench 202 without recreating the verification environment 204 and/or one or more of its components (e.g. agents).

Figure 3:
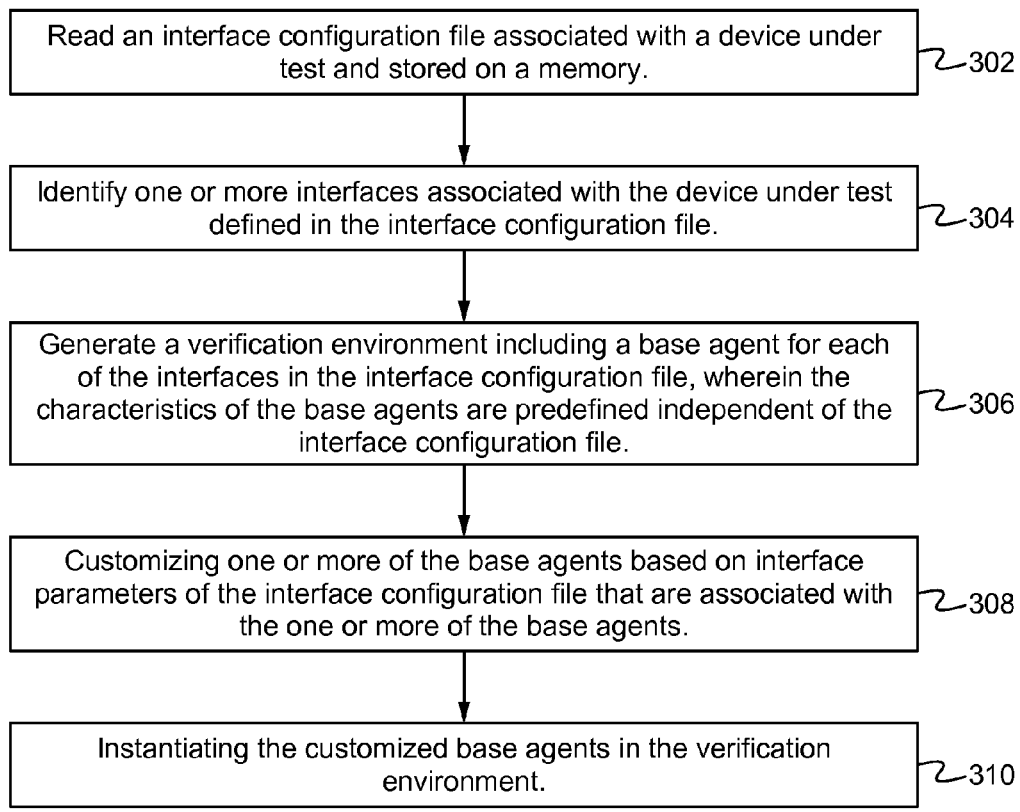
FIG. 3 illustrates a method of generating a test bench according to some embodiments.

FIG. 3 illustrates a method of generating a test bench according to some embodiments. As shown in FIG. 3, a testbench builder application reads an interface configuration file associated with a DUT 212 at the step 302. The testbench builder application then identifies one or more interfaces 222 associated with the DUT 212 defined in the interface configuration file at the step 304. Based on the identified interfaces 222, the application generates a verification environment 204 within the testbench 202 including a base agent 206 for each of the interfaces 222 in the interface configuration file at the step 306. In some embodiments, the generating of the verification environment further comprises generating one of more of the group comprising a reference model 208, a dispatcher 1124 and a scoreboard 210. In some embodiments, the characteristics of the base agents 206 are predefined independent of the interface configuration file. For example, if the base agents 206 are associated with interfaces 222 that do not require any customization, the application is able to apply default settings to the transporter and/or transaction class of the base agents 206 independent of the interface configuration file. These base agents 206 have default settings that enable them to operate within the verification environment 204 without customization.

Based on interface parameters of the interface configuration file, the application is able to customize one or more of the base agents 206 that are associated with the described interface parameters at the step 308. As a result, the customized base agents 206 are able to meet the transporter and/or transaction class needs of the interface 222 with which they are associated. Then the application instantiates the customized base agents 206 in the verification environment 204 at the step 310. This instantiation is able to further comprise instantiation of one or more of the group comprising the base agents 206, the scoreboard 210, the reference module 208 and the dispatcher 1124, and the coupling/binding of all of the agents 206, interfaces 222, the DUT 212, the scoreboard 210, dispatcher 224 and/or the reference module 208 together as desired via one or more ports. In particular, the instantiation and/or generation of the dispatcher 224 is able to comprise coupling all the agents 206 to one of the ports of the dispatcher 224 and generating the agent table 226 which associates the agents/interfaces/ports that are coupled to the dispatcher 224 with the scoreboard 210 or the reference model 208 as described above. For example, the agent table 226 is able to associate the addresses of the ports that receive the data from the agents 206 with the address of the port coupled to the scoreboard 210 or the address of the port coupled to the reference model 208. In some embodiments, the interface parameters for each of the interfaces 222 comprise names of the ports associated with the interface, width of the ports associated with the interface, direction of the ports associated with the interface, and whether each of the ports associated with the interface is for communicating control data or non-control data. Additionally, in some embodiments the agent table 226 is generated by the builder application based on the interface parameters and the binding of the ports within the verification environment.

Figure 4:
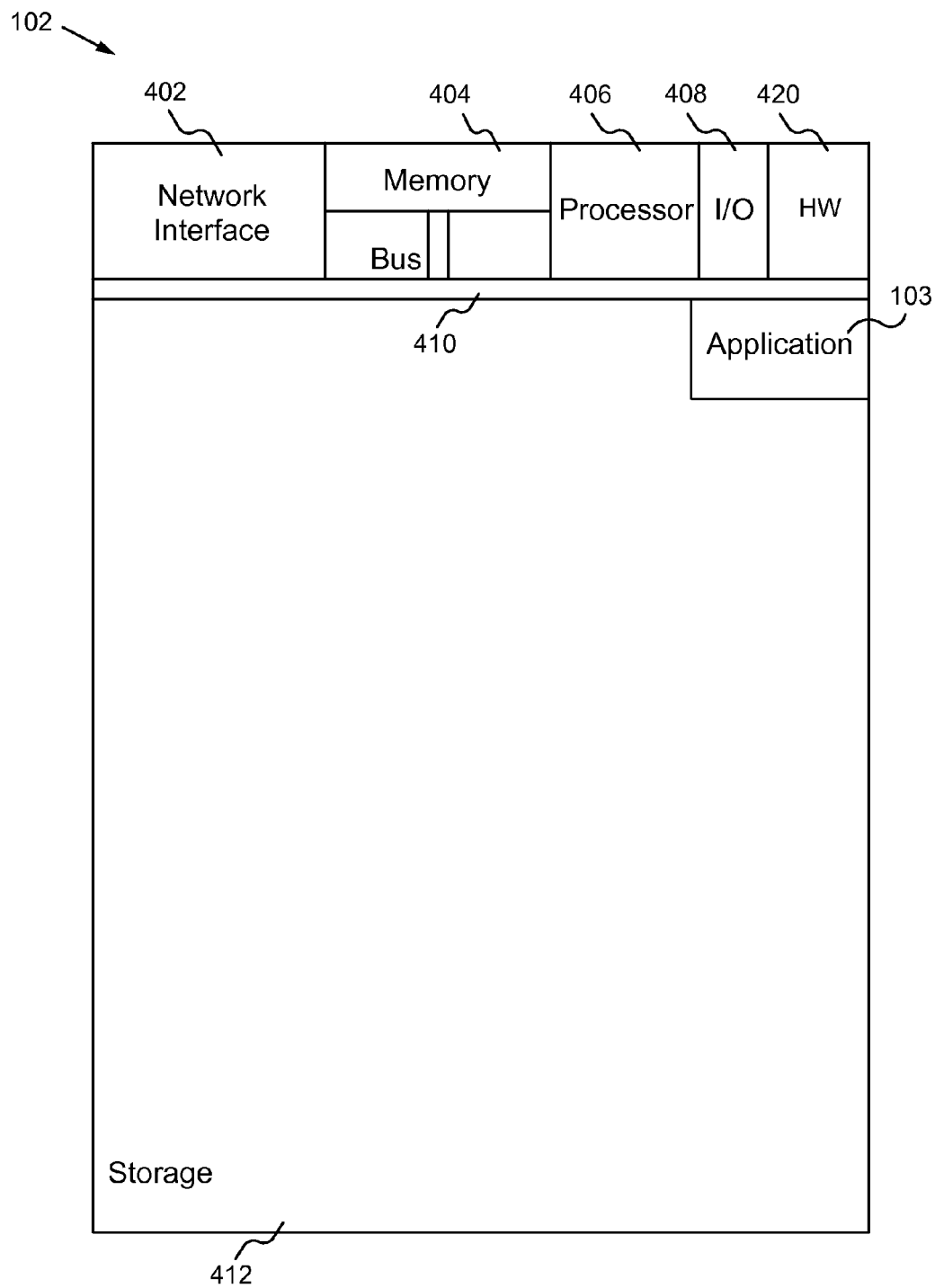
FIG. 4 illustrates a block diagram of an exemplary testbench builder device configured to implement the testbench builder application according to some embodiments.

FIG. 4 illustrates a block diagram of an exemplary testbench builder device 102 configured to implement the testbench builder application 103 according to some embodiments. The testbench builder device 102 is able to acquire, store, compute, communicate and/or display information such as images and videos. In general, a hardware structure suitable for implementing the device 102 includes a network interface 402, a memory 404, a processor 406, I/O device(s) 408, a bus 410 and a storage device 412. Alternatively, one or more of the illustrated components are able to be removed or substituted for other components well known in the art. The choice of processor is not critical as long as a suitable processor with sufficient speed is chosen. The memory 404 is able to be any conventional computer memory known in the art. The storage device 412 is able to include a hard drive, CDROM, CDRW, DVD, DVDRW, flash memory card or any other storage device. The testbench builder device 102 is able to include one or more network interfaces 402. An example of a network interface includes a network card connected to an Ethernet or other type of LAN. The I/O device(s) 408 are able to include one or more of the following: keyboard, mouse, monitor, display, printer, modem, touchscreen, button interface and other devices. Testbench builder application(s) or module(s) 103 used to generate the testbench as described above are able to be stored in the storage device 412 and/or memory 404 and processed as applications are typically processed. More or less components shown in FIG. 4 are able to be included in testbench builder device 102. In some embodiments, testbench builder hardware 420 is included. Although as shown in FIG. 4 the testbench builder device 102 includes applications 103 and hardware 420 for implementing the testbench generation, it is understood that the testbench builder device 102 is able to be implemented on a computing device in solely hardware, firmware or software, or any combination thereof.

In some embodiments, the testbench builder application(s) 103 include several applications and/or modules. In some embodiments, the testbench builder application(s) 103 include a separate module for each of the graphical user interface features described above. The modules implement the method described herein. In some embodiments, fewer or additional modules are able to be included. Examples of suitable computing devices include a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, an iPod®, a video player, a DVD writer/player, a Blu-ray® writer/player, a television, a home entertainment system or any other suitable computing device.

The testbench builder system, method and device described herein provides numerous advantages. In particular, the builder provides the advantage of automatically creating a fully operational testbench based on inputted interface data. Additionally, the builder provides the advantage of enabling the dynamic adjustment of the testbench via the user interface or a modified interface file without having the fully recreate a new testbench. Moreover, the builder provides the advantage of automatically generating generic agents for interfaces that do not require a customized agent thereby increasing the speed of the testbench generation process. Further, the testbench system provides the benefit of enabling the generic drivers to be generated independent of the interface characteristics such as handshake protocol. Additionally, the dispatcher provides the benefit of reducing the connection complexity of the verification environment. In particular, the dispatcher provides a single component that all the agents are able to be coupled and automatically send data to instead of each agent needing a separate connection established to either the reference model or a single line to the scoreboard. As a result, the dispatcher is able to efficiently route the data either on a single connection to the reference model or a single line to the scoreboard. Moreover, the loopback ports provide the advantage of enabling testing data dependency to be handled on an agent level without the use of a top level multi-layer or virtual sequencer. Also, the use of timestamps provides the advantage of enabling the each of the agents to adjust for latency within the verification environment without the use of a virtual or multilayer sequencer.

Packet Tracking in a Verification Environment

There does not currently exist a standard way of tracking packets in, for example, a system on chip (SoC) where packet processing occurs. Packet processing can include one or a combination of packet modifications, packet splits, packet replications and packet drops. Traditionally, each testbench (e.g., verification environment) includes its own proprietary implementation that is built into a reference model. Since prior art packet tracking schemes are specific, a different packet tracker is needed for each reference model.

In some embodiments, the testbench builder application described above includes a standardized packet tracking module for tracking packets in a device under test (DUT). The packet tracking module is a standalone module that can used in any verification environment and, hence, with any reference model. The packet tracking module can be instantiated and its set of routines can be called by different components of a verification environment to track packets during simulation or testing. An exemplary verification environment is the verification environment 204 of FIG. 2. Other verification environments are contemplated.

In some embodiments, the packet tracking module includes an associative data structure of packet identifiers that is indexed by a unique value. The associative data structure can be an array, a buffer, a table or the like. The unique value can be a cyclic redundancy check (CRC) value, a hash value, or the like of one or more headers of a packet being tracked. The associative data structure facilitates the correlation of packets entering and exiting the DUT. In particular, information of each packet generated during simulation is stored as an entry in the associative data structure. Each time the packet is being processed, the entry in the associative data structure is updated accordingly. When the entry is no longer needed, the entry is removed from the associative data structure. In some embodiments, the entry is removed from the associative data structure after a comparison between the entry and one or more fields of the packet. As is further explained below, the packet tracking module also includes a counter for identifying the packets being tracked in the verification environment.

In some embodiments, the set of routines included in the packet tracking module includes (1) a routine (issuePktId) for issuing the next packet identifier based on the counter, (2) a routine (insertPktId) for inserting an entry of a corresponding packet in the associative data structure, (3) a routine (fetchPktId) for fetching the packet identifier of a packet from the associative data structure, (4) a routine (removePktId) for removing an entry of a corresponding packet from the associative data structure, such as after a comparison, and (5) a routine (eraseTbl) for clearing all entries in the associative data structure. In some embodiments, the eraseTbl routine is called before and/or after simulation to clear out all entries in the associative data structure. The packet tracking module can include additional routines. As demonstrated in FIGS. 16-22, the set of routines allows for tracking of packets in different scenarios, including specific scenarios of an unmodified packet, a modified packet, a replicated packet, a split packet, and a merged packet. In these scenarios, assume that the CRC of each packet is unique.

Figure 16:
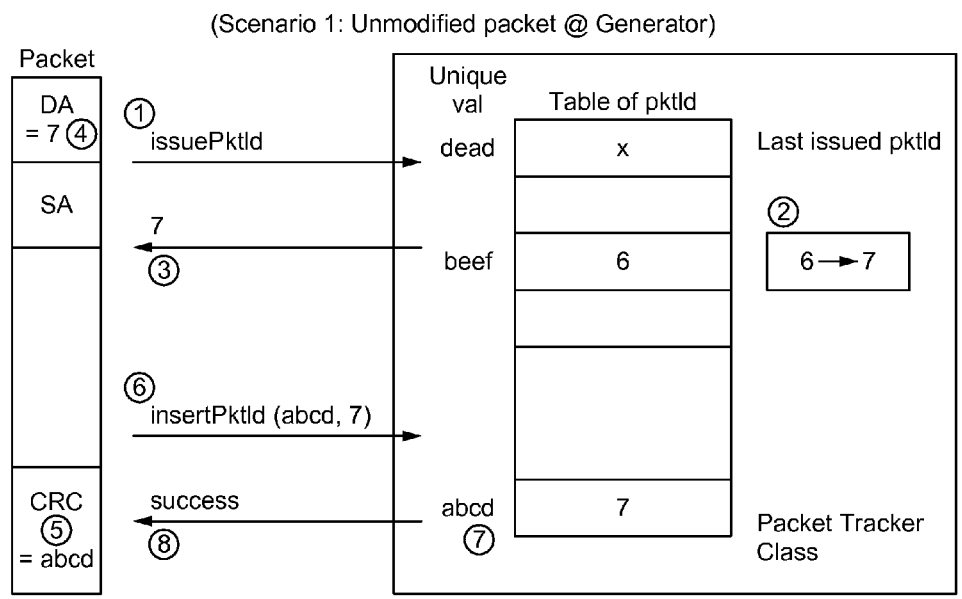
FIGS. 16-22 illustrate tracking of packets in different scenarios according to some embodiments.
Figure 17:
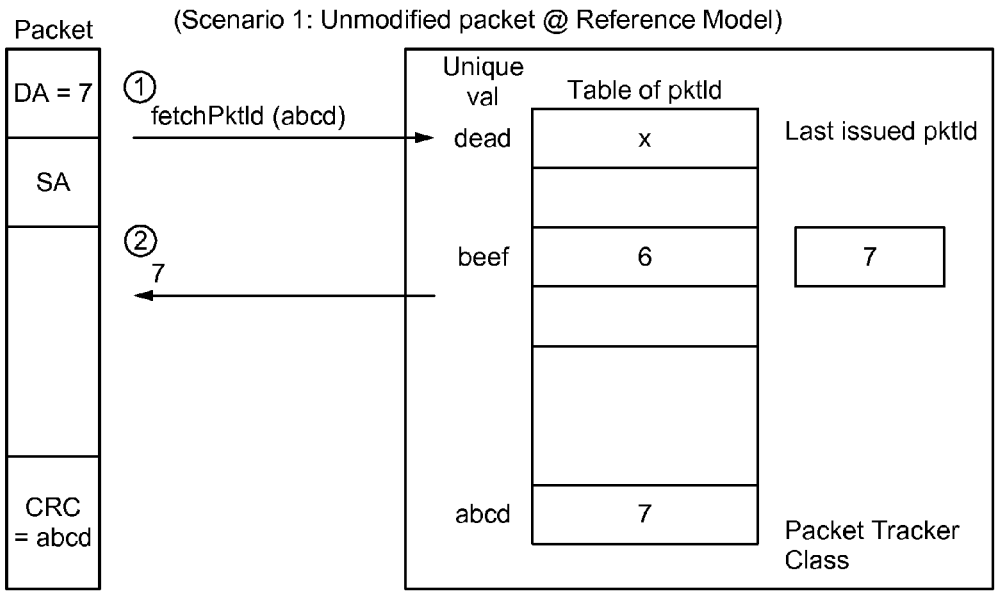
Figure 18:
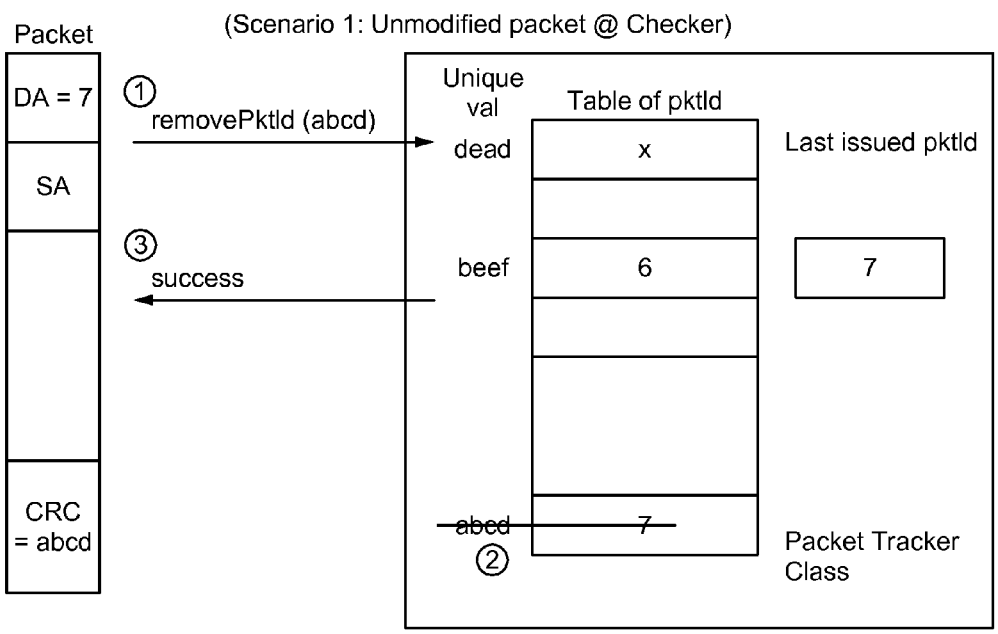

FIGS. 16-18 illustrates a first scenario of an unmodified packet according to some embodiments. In particular, FIG. 16 illustrates the first scenario of the unmodified packet at a generator, FIG. 17 illustrates the first scenario of the unmodified packet at a reference model, and FIG. 18 illustrates the first scenario of the unmodified packet at a checker. One or more of the generator, the reference model and the checker can be separately implemented in distinct units or can be integrally implemented in a single unit. The generator (e.g., sequencer), the reference model and the checker (e.g., scoreboard) are discussed elsewhere herein.

Referring to FIG. 16, when a new packet is generated during simulation, the generator makes a function call to the issuePktId routine at step 1. The counter of the packet tracking module typically keeps track of the last issued packet identifier. In the example of FIG. 16, the current value of the counter is 6. In response to the issuePktId routine call at the step 1, the packet tracking module updates the counter (such as by incrementing by one or some other value) with the next packet identifier at step 2 and returns the next packet identifier (e.g., "7") to the generator at step 3. The generator, just before the packet is sent to the DUT, inserts the packet identifier 7 as a field into the packet at step 4, and calculates the CRC (e.g., "abcd") of the packet at step 5. In some embodiments, the packet identifier is embedded in a less-used field of the packet. In some embodiments, the packet identifier is in the last four bytes of the payload of the packet before the CRC. In all of these scenarios, for illustration purposes, the packet identifier is embedded in the destination address (DA) field. The generator then makes a function call to the insertPktId routine with the CRC (e.g., "abcd") and the packet identifier (e.g., "7") of the packet as its parameters at step 6. The packet tracking module inserts an entry (for that packet) into the associative data structure based on the parameters at step 7 and returns the result (e.g., "success") of the function call at the step 6 to the generator at step 8. In some embodiments, the associative data structure is of packet identifiers that are indexed by the unique value.

Continuing with the example, but now referring to FIG. 17, to verify the packet at any stage of the simulation, the reference model makes a function call to the fetchPktId routine with the CRC (e.g., "abcd") of the packet as its parameter at step 1. The packet tracking module uses the provided CRC as an index into the associative data structure and returns the corresponding packet identifier (e.g., "7") from the associative data structure to the reference model at step 2. The returned value at the step 2 can be compared with the value in the DA field of the packet to verify the packet.

Continuing with the example, but now referring to FIG. 18, assume the entry for the packet in the associative data structure is no longer needed, the checker makes a function call to the removePktId routine with the CRC (e.g., "abcd") of the packet as its parameter at step 1. The packet tracking module removes the entry from the associative data structure based on the parameter at step 2 and returns the result (e.g., "success") of the function call at the step 1 to the checker at step 3.

As demonstrated in FIGS. 16-18, in the first scenario of the unmodified packet, the generator is able to make function calls to the issuePktId routine and the insertPktId routine, the reference model is able to make function calls to the fetchPktId routine, and the checker is able to make function calls to the removePktId routine. However, as demonstrated below, the generator, the reference model and the checker are not limited to these routines. In some embodiments, any module is able to make a function call to any routine. It should be clear from these scenarios that the issuePktId routine is a request to issue the next packet identifier, the insertPktId routine is to enter a packet identifier into the associative data structure, the fetchPktId is to ask for the packet identifier of a packet, and the removePktId is to delete an entry from the associative data structure.

Figure 19:
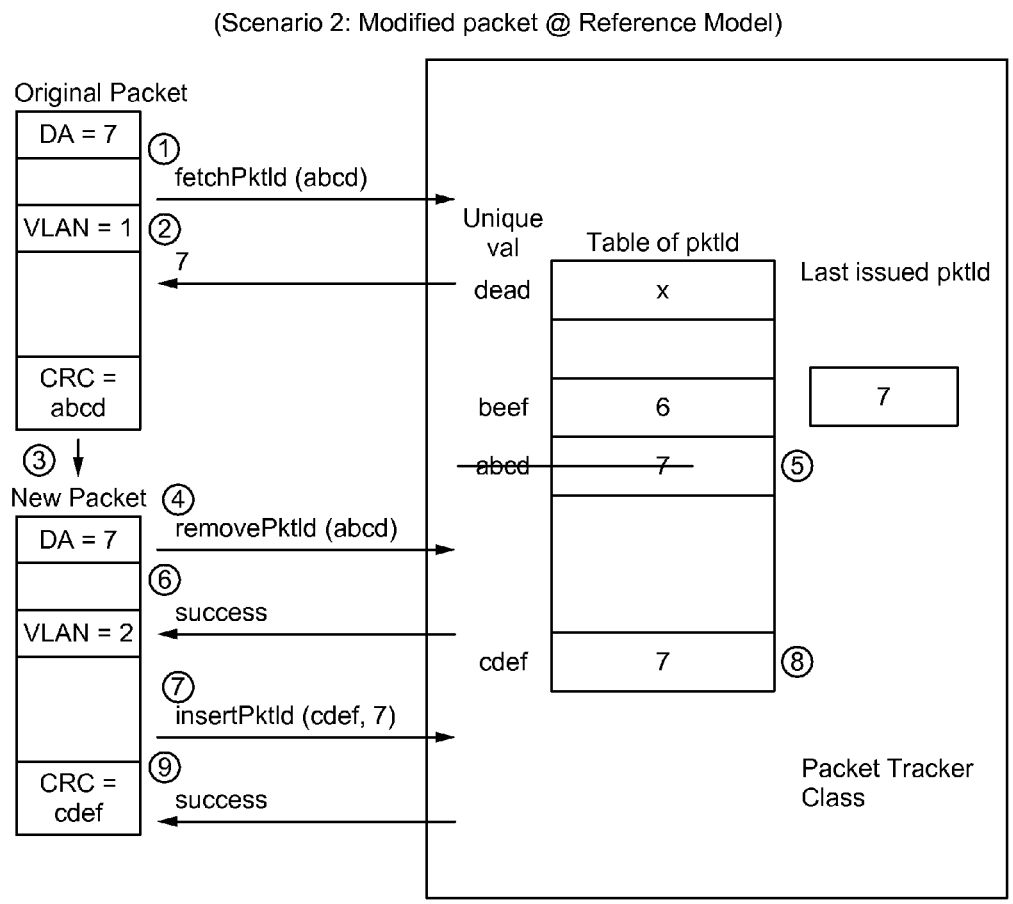

FIG. 19 illustrates a second scenario of a modified packet at a reference model according to some embodiments. Assume the original packet includes 7 in its DA field, 1 in its VLAN field and "abcd" as the CRC. During modification, the value of the VLAN field is to be modified from 1 to 2. First, prior to packet modification, the reference model verifies the validity of the original packet by making a function call to the fetchPktId routine with the CRC (e.g., "abcd") of the original packet as its parameter at step 1. The packet tracking module uses the provided CRC as an index into the associative data structure and returns the corresponding packet identifier (e.g., "7") from the associative data structure to the reference model at step 2. Since the returned value at the step 2 matches the value in the DA field of the original packet, the original packet is therefore verified and is then modified at step 3. The packet identifier remains the same since the same original packet is simply being modified. However, the value of the VLAN field is changed from 1 to 2, and the CRC (e.g., "cdef") is recalculated and updated in the modified packet at step 3. CRC typically changes when data of a packet changes. The reference model makes a function call to the removePktId routine with the CRC (e.g., "abcd") of the original packet as its parameter at step 4 since the entry for the original packet is no longer needed. The packet tracking module removes the entry from the associative data structure based on the parameter at step 5 and returns the result (e.g., "success") of the function call at the step 4 to the reference model at step 6. In some embodiments, the step 3 can occur concurrently or after the steps 4-6. The reference model then makes a function call to the insertPktId routine with the CRC (e.g., "cdef") and the packet identifier (e.g., "7") of the modified packet as its parameters at step 7. The packet tracking module inserts an entry (for the modified packet) into the associative data structure based on the parameters at step 8 and returns the result (e.g., "success") of the function call at the step 7 to the reference model at step 9.

Figure 20:
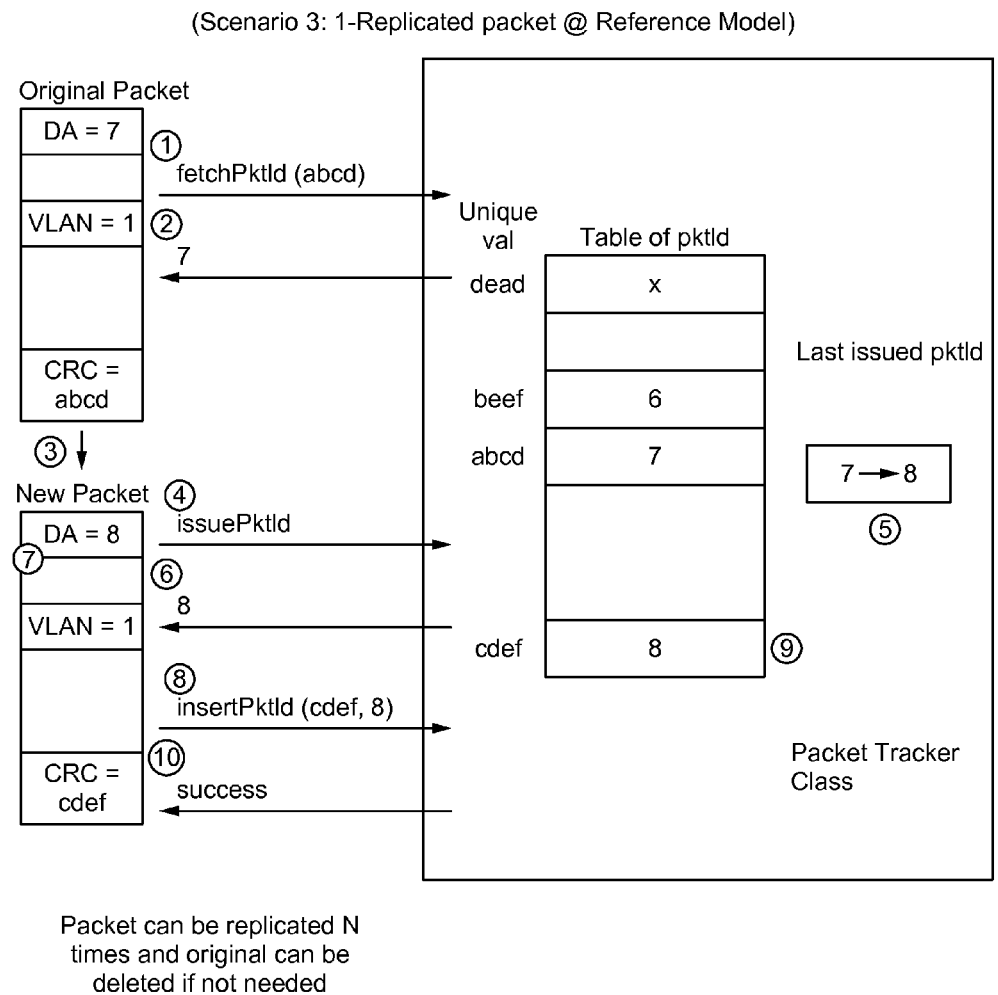

FIG. 20 illustrates a third scenario of a replicated packet at a reference model according to some embodiments. Assume the original packet includes 7 in its DA field, 1 in its VLAN field and "abcd" as the CRC. During replication, a new packet is generated from the original packet. The field values are the same for both the original packet and the replicated packet except for those fields that are indicated below. First, prior to replication, the reference model verifies the validity of the original packet by making a function call to the fetchPktId routine with the CRC (e.g., "abcd") of the original packet as its parameter at step 1. The packet tracking module uses the provided CRC as an index into the associative data structure and returns the corresponding packet identifier (e.g., "7") from the associative data structure to the reference model at step 2. Since the returned value at the step 2 matches the value in the DA field of the original packet, the original packet is therefore verified and a new packet is replicated from the original packet at step 3. Since the replicated packet is a new additional packet, the replicated packet is associated with a different packet identifier than that of the original packet. The reference model makes a function call to the issuePktId routine at step 4. As explained above, the packet tracking module typically keeps track of the last issued packet identifier via the counter. In the example of FIG. 20, the current value of the counter is 7. In response to the issuePktId routine call at the step 4, the packet tracking module updates the counter with the next packet identifier at step 5 and returns the next packet identifier (e.g., "8") to the reference model at step 6. The replicated packet is updated with the new packet identifier (e.g., "8") in the DA field, and the CRC (e.g., "cdef") is recalculated and updated in the replicated packet at step 7. Since this new packet is a replication of the original packet, values of the fields other than the DA field and the CRC remain the same. The reference model then makes a function call to the insertPktId routine with the CRC (e.g., "cdef") and the packet identifier (e.g., "8") of the replicated packet as its parameters at step 8. The packet tracking module inserts an entry (for the replicated packet) into the associative data structure based on the parameters at step 9 and returns the result (e.g., "success") of the function call at the step 8 to the reference model at step 10. It should be noted that a packet can be replicated numerous times and the original entry can be deleted from the associative data structure if the original entry is no longer needed. The original entry can be deleted from the associative data structure by making a function call to the removePktId routine.

In the following scenarios of packet split and packet merge, the same set of routines can be used. In some embodiments, the higher order of bits of the unique value will contain a "segment" number. Segment number 0 indicates an original packet, while segment number x indicates the $x^{th}$ split packet. For example, segment number 1 indicates the first split packet and segment number 2 indicates the second split packet. In some embodiments, each segment number is stored in the payload of a packet. The combined value of the segment number and the CRC is used as an index into the associative data structure.

Figure 21:
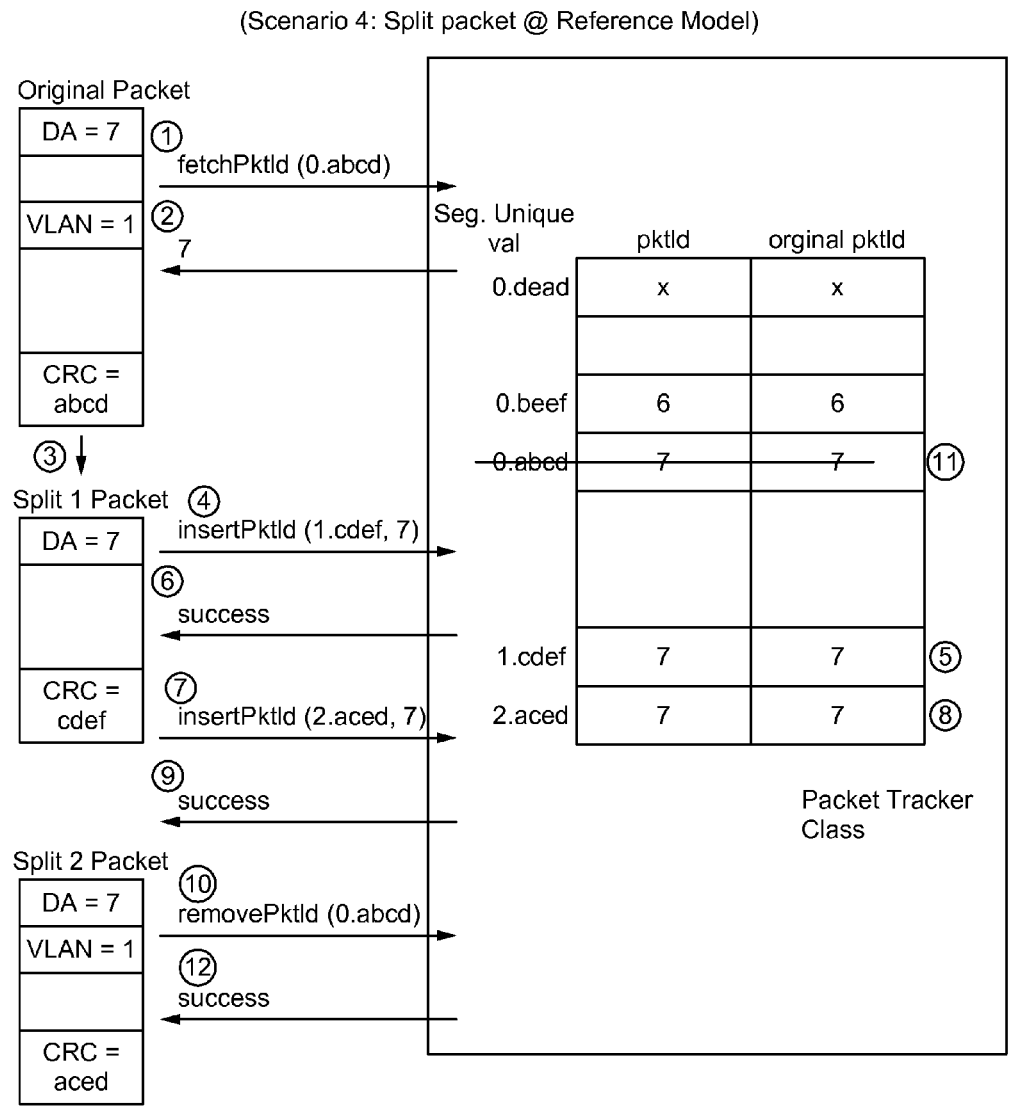

FIG. 21 illustrates a fourth scenario of a split packet at a reference model according to some embodiments. Assume the original packet includes 7 in its DA field, 1 in its VLAN field and "abcd" as the CRC, and is associated with segment number 0. The original packet is to be split into two split packets, with Split 1 packet including a first portion of the fields of the original packet and Split 2 packet including a second portion of the fields of the original packet. First, prior to packet split, the reference model verifies the validity of the original packet by making a function call to the fetchPktId routine with the combination of the segment number and the CRC (e.g., "0.abcd") of the original packet as its parameter at step 1. The packet tracking module uses the provided combined value as an index into the associative data structure and returns the corresponding packet identifier (e.g., "7") from the associative data structure to the reference model at step 2. Since the returned value at the step 2 matches the value in the DA field of the original packet, the original packet is therefore verified and is then split into two split packets at step 3. The packet identifier (e.g., "7") is the same for both split packets, which identifies them as being split from the same packet. However, Split 1 packet is associated with segment number 1 and Split 2 packet is associated with segment 2. In some embodiments, each segment number is stored in the payload of a corresponding packet. The CRC is calculated for each split packet (e.g., "cdef" for Split 1 packet and "aced" for Split 2 packet). After the original packet is split, the reference model makes a function call to the insertPktId routine with the combination of the segment number and the CRC (e.g., "1.cdef") and the packet identifier (e.g., "7") of the Split 1 packet as its parameters at step 4. The packet tracking module inserts an entry (for the Split 1 packet) into the associative data structure based on the parameters at step 5 and returns the result (e.g., "success") of the function call at the step 4 to the reference model at step 6. Similarly, the reference model makes a function call to the insertPktId routine with the combination of the segment number and the CRC (e.g., "2.aced") and the packet identifier (e.g., "7") of the Split 2 packet as its parameters at step 7. The packet tracking module inserts an entry (for the Split 2 packet) into the associative data structure based on the parameters at step 8 and returns the result (e.g., "success") of the function call at the step 7 to the reference model at step 9. The reference model then makes a function call to the removePktId routine with the combination of the segment number and the CRC (e.g., "0.abcd") of the original packet as its parameter at step 10 since the entry for the original packet is no longer needed. The packet tracking module removes the entry from the associative data structure based on the parameter at step 11 and returns the result (e.g., "success") of the function call at the step 10 to the reference model at step 12.

Figure 22:
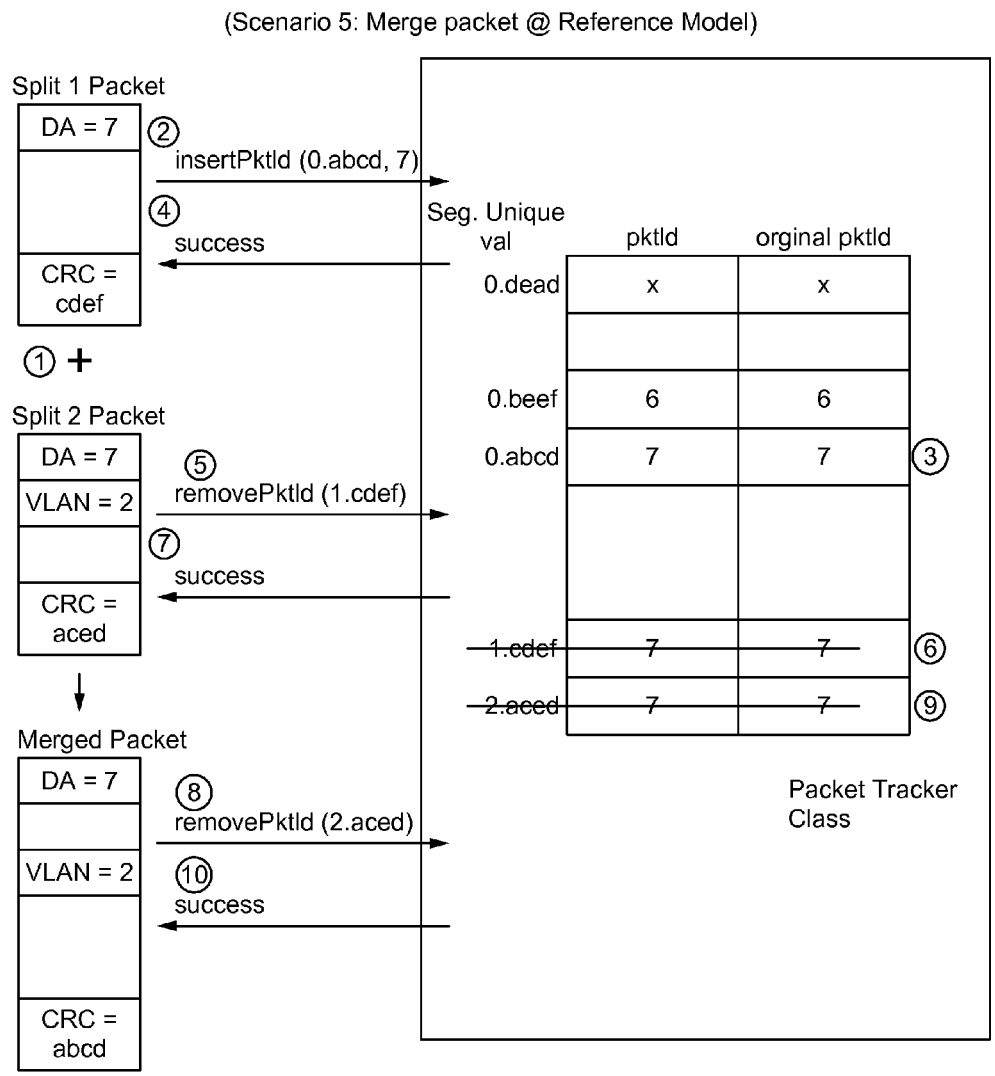

FIG. 22 illustrates a fifth scenario of a merged packet at a reference model according to some embodiments. The reference model combines two previously split packets (e.g., "Split 1 packet" and "Split 2 packet") to calculate the CRC (e.g., "abcd") of the merged packet at step 1. Typically, the two split packets have the same packet identifier (e.g., "7") to identify them as being split from the same packet. The reference model makes a function call to the insertPktId routine with the combination of the segment number and the CRC (e.g., "0.abcd") and the packet identifier (e.g., "7") of the merged packet as its parameters at step 2. The packet tracking module inserts an entry (for the merged packet) into the associative data structure based on the parameters at step 3 and returns the result (e.g., "success") of the function call at the step 2 to the reference model at step 4. The reference model makes a function call to the removePktId routine with the combination of the segment number and the CRC (e.g., "1.cdef") of the Split 1 packet as its parameter at step 5 since the entry for Split 1 packet is no longer needed. The packet tracking module removes the entry from the associative data structure based on the parameter at step 6 and returns the result (e.g., "success") of the function call at the step 5 to the reference model at step 7. Similarly, the reference model makes a function call to the removePktId routine with the combination of the segment number and the CRC (e.g., "2.aced") of the Split 2 packet as its parameter at step 8 since the entry for Split 2 packet is no longer needed. The packet tracking module removes the entry from the associative data structure based on the parameter at step 9 and returns the result (e.g., "success") of the function call at the step 8 to the reference model at step 10.

Although FIGS. 16-22 illustrate simple scenarios of packet modification, packet replication, packet split and packet merge, a more complex processing can occur. For example, a packet can be first replicated, and the replicated packet can then be modified. One skilled in the art would appreciate that the same set of routines can also be used.

Figure 23:
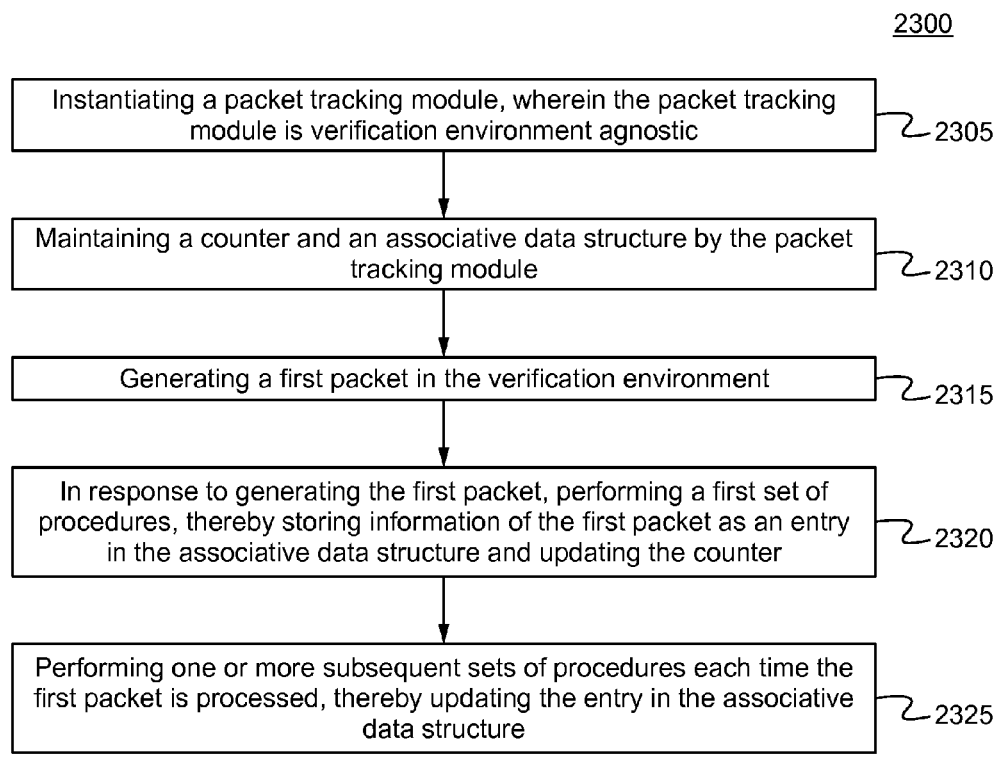
FIGS. 23-28 illustrate methods of tracking packets within a verification environment of a testbench according to some embodiments.

FIG. 23 illustrates a method 2300 of tracking packets within a verification environment of a testbench according to some embodiments. At a step 2305, a packet tracking module is instantiated priority to simulation or testing. In some embodiments, the packet tracking module is verification environment agnostic.

At a step 2310, a counter and an associative data structure are maintained by the packet tracking module. In some embodiments, the associative data structure is for storing packet identifiers that are indexed by a unique value. In some embodiments, the counter is for identifying the packets being tracked in the verification environment.

At a step 2315, a first packet is generated in the verification environment. In some embodiments, the verification environment includes a generator, a reference model and a checker. Generally, the generator generates the packet, the reference model mimics operation of a device under test, and the checker performs comparisons of data received from the reference model and from the device under test.

At a step 2320, in response to the first packet being generated, a first set of procedures is performed. Information of the first packet is thereby stored as an entry in the associative data structure and updating the counter. Details of the step 2320 are further discussed in FIG. 24.

Figure 24:
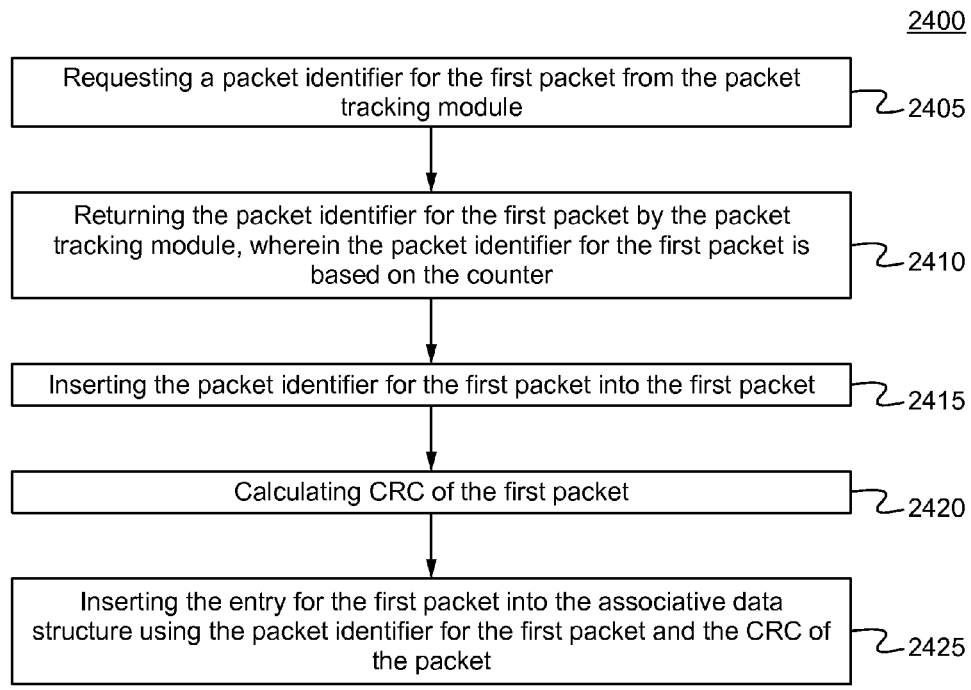

Referring to FIG. 24, at a step 2405, a packet identifier for the first packet is requested from the packet tracking module. At a step 2410, the packet identifier for the first packet is returned by the packet tracking module. Typically, the packet identifier for the first packet is based on the counter. At a step 2415, the packet identifier for the first packet is inserted into the first packet. At a step 2420, CRC of the first packet is calculated. At a step 2425, the entry for the first packet is inserted into the associative data structure using the packet identifier for the first packet and the CRC of the packet.

Referring back to FIG. 23, at a step 2325, one or more subsequent sets of procedures are performed each time the first packet is processed, thereby updating the entry in the associative data structure. Details of each of the one or more subsequent sets of procedures are further discussed in FIGS. 25-28. In particular, FIG. 25 illustrates a set of procedures for packet modification, FIG. 26 illustrates a set of procedures for packet replication, FIG. 27 illustrates a set of procedures for packet split, and FIG. 28 illustrates a set of procedures for packet merge.

Figure 25:
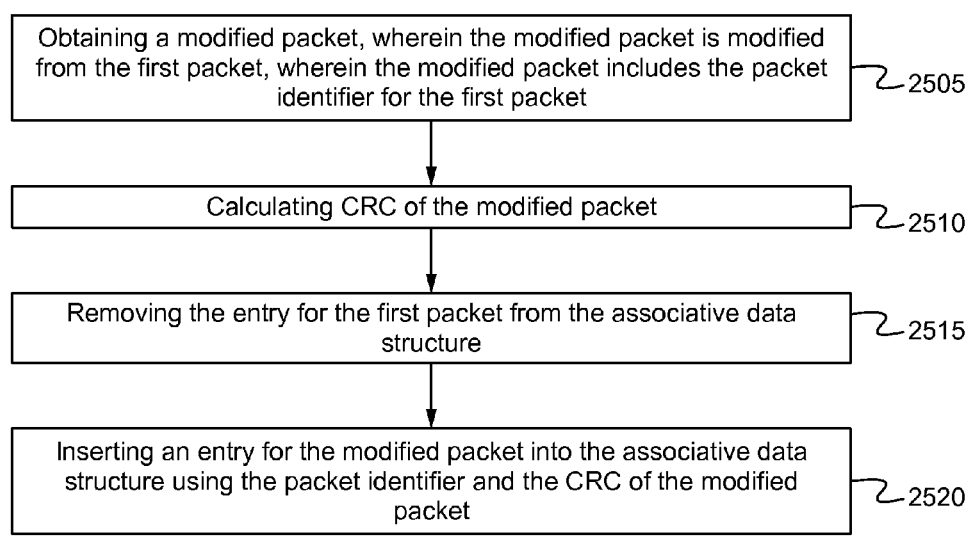

Now referring to FIG. 25, at a step 2505, a modified packet is obtained. The modified packet is modified from the first packet. The modified packet includes the packet identifier for the first packet. At a step 2510, CRC of the modified packet is calculated. At a step 2515, the entry for the first packet is removed from the associative data structure. At a step 2520, an entry for the modified packet is inserted into the associative data structure using the packet identifier and the CRC of the modified packet.

Figure 26:
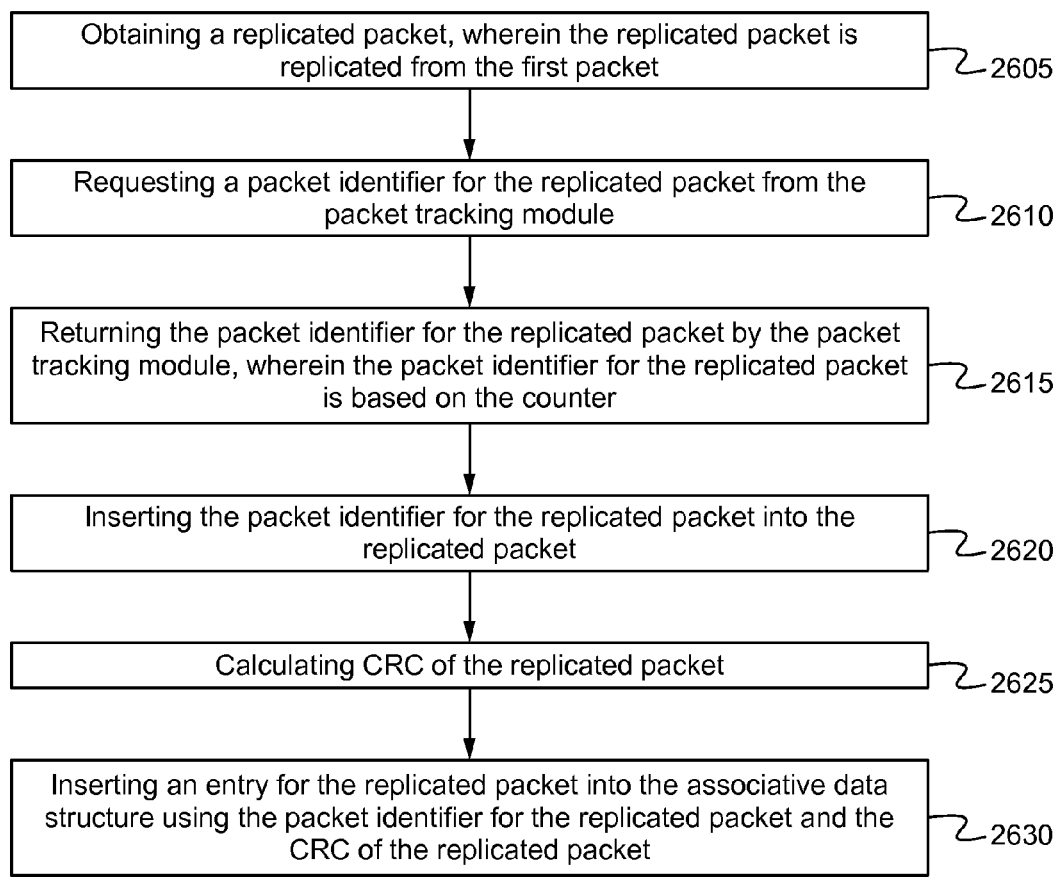

Now referring to FIG. 26, at a step 2605, a replicated packet is obtained. The replicated packet is replicated from the first packet. At a step 2610, a packet identifier for the replicated packet is requested from the packet tracking module. At a step 2615, the packet identifier for the replicated packet is returned by the packet tracking module. The packet identifier for the replicated packet is based on the counter. At a step 2620, the packet identifier for the replicated packet is inserted into the replicated packet. At a step 2625, CRC of the replicated packet is calculated. At a step 2630, an entry for the replicated packet is inserted into the associative data structure using the packet identifier for the replicated packet and the CRC of the replicated packet.

Figure 27:
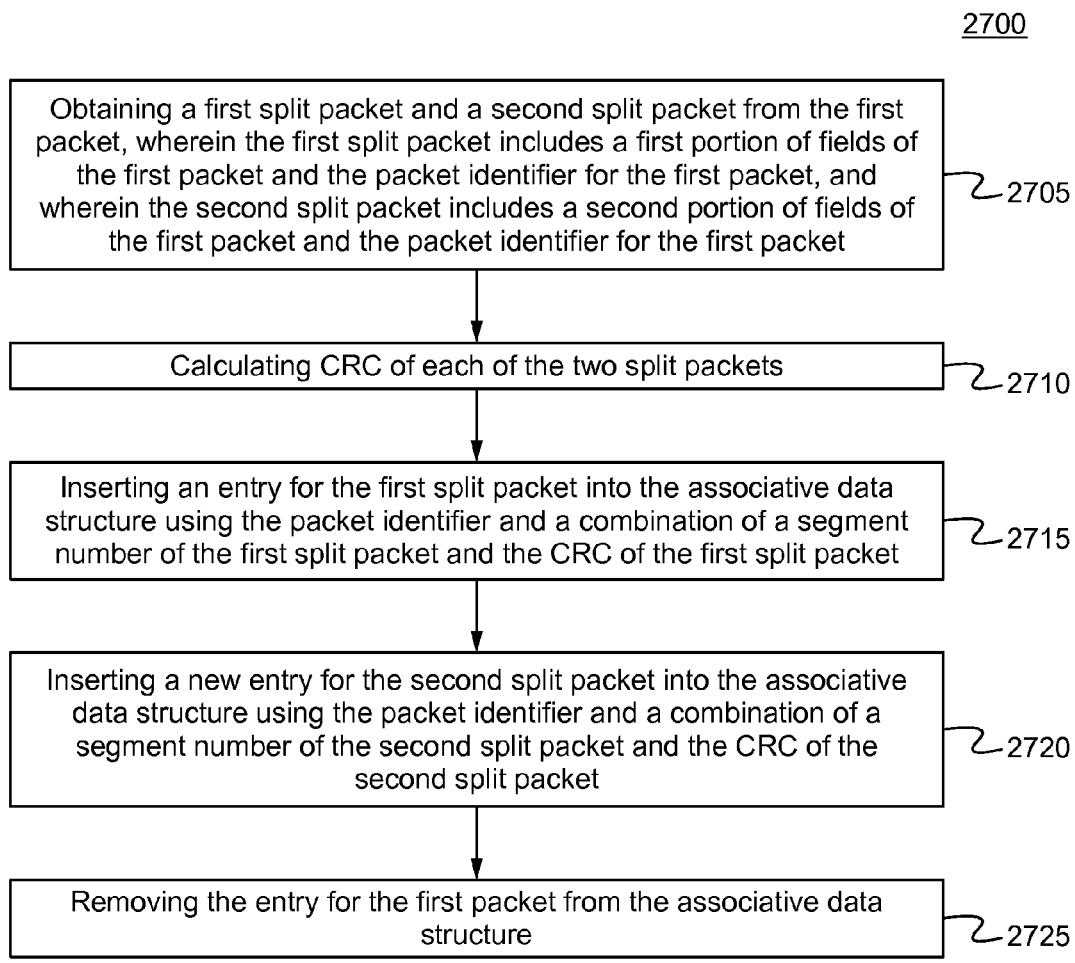
Figure 28:
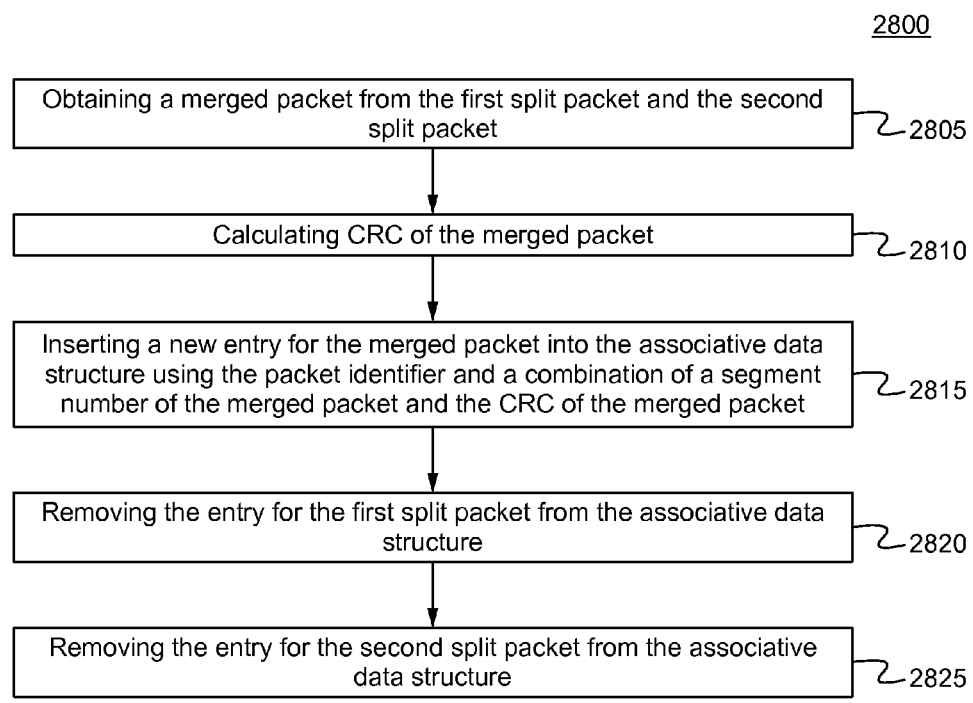

Now referring to FIG. 27, at a step 2705, a first split packet and a second split packet are obtained from the first packet. The first split packet includes a first portion of fields of the first packet and the packet identifier for the first packet, and the second split packet includes a second portion of fields of the first packet and the packet identifier for the first packet. At a step 2710, CRC of each of the two split packets is calculated. At a step 2715, an entry for the first split packet is inserted into the associative data structure using the packet identifier and a combination of a segment number of the first split packet and the CRC of the first split packet. At a step 2720, a new entry for the second split packet is inserted into the associative data structure using the packet identifier and a combination of a segment number of the second split packet and the CRC of the second split packet. At a step 2725, the entry for the first packet is removed from the associative data structure.

Now referring to FIG. 28, at a step 2805, a merged packet is obtained from the first split packet and the second split packet. At a step 2810, CRC for the merged packet is calculated. At a step 2815, a new entry for the merged packet is inserted into the associative data structure using the packet identifier and a combination of a segment number of the merged packet and the CRC of the merged packet. At a step 2820, the entry for the first split packet is removed from the associative data structure. At a step 2825, the entry for the second split packet is removed from the associative data structure.

In some embodiments, the packet tracking module is a class that is implemented in a programming language, such as C++. However, the packet tracking module can be implemented in another suitable programming language. As demonstrated in the above scenarios, the packet tracking module does not require additional information, such as packet width or interface information. The packet tracking module maintains a data structure of packet identifiers that are indexed by a unique value such as by CRC or by a combination of header fields. The packet tracking module is generic plug-and-play module that can be advantageously used in any verification environment.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A testbench system comprising:
a device under test;
a verification environment including a plurality of agents communicatively coupled with the device under test, wherein the plurality of agents transmit packets to and receive packets from the device under test for testing the device under test; and
a non-transitory computer readable memory storing a packet tracking module communicatively coupled with the plurality of agents, wherein the packet tracking module includes:
an associative data structure that stores a plurality of packet identifiers and pairs one or more of the packet identifiers with unique values derived from the packets;
a counter that indicates which one of the packet identifiers that was most recently paired with one of the unique values by updating a counter value each time one of the packet identifiers is paired with one of the unique values; and
a set of routines for updating the associative data structure and verifying the identity of one or more of the packets in the verification environment based on the pairs of the packet identifiers and the unique values of the associative data structure.

2. The testbench system of claim 1, wherein the set of routines is called by one or more components of the verification environment.

3. The testbench system of claim 2, wherein the one or more components of the verification environment includes a generator, a reference model and a checker.

4. The testbench system of claim 3, wherein the generator generates the packets during the testing, the reference model mimics operation of the device under test, and the checker performs comparisons of data received from the reference model and from the device under test.

5. The testbench system of claim 1, wherein information of each packet of the packets is stored as an entry in the associative data structure, wherein the entry is updated each time the packet is processed, and wherein the entry is deleted from the associative data structure when the entry is no longer needed.

6. The testbench system of claim 1, wherein the set of routines includes a routine (issuePktId) for issuing an issued packet identifier of the packet identifiers based on the counter, a routine (insertPktId) for inserting an entry of a packet of the packets into the associative data structure, a routine (fetchPktId) for fetching a fetched packet identifier of the packet identifiers from the associative data structure, a routine (removePktId) for removing an entry from the associative data structure, and a routine (eraseTbl) for clearing all entries in the associative data structure.

7. The testbench system of claim 6, wherein the eraseTbl routine is called before the testing starts, after the testing completes or both.

8. The testbench system of claim 6, wherein the set of routines allows tracking of an unmodified packet.

9. The testbench system of claim 6, wherein the set of routines allows tracking of a modified packet.

10. The testbench system of claim 6, wherein the set of routines allows tracking of a replicated packet.

11. The testbench system of claim 6, wherein the set of routines allows tracking of a merged packet.

12. The testbench system of claim 1, wherein higher order bits of the unique value contains a segment number, wherein the segment number indicates a whole packet or which split packet.

13. The testbench system of claim 12, wherein a combined value of the segment number and a cyclic redundancy check (CRC) value is used as an index into the associative data structure.

14. The testbench system of claim 13, wherein the segment number of a packet is stored in the payload of the packet.

15. A non-transitory computer readable medium storing a packet tracking module for tracking packets in a verification environment, the packet tracking module comprising:
an associative data structure that stores a plurality of packet identifiers and pairs one or more of the packet identifiers with unique values derived from the packets;
a counter that indicates which one of the packet identifiers that was most recently paired with one of the unique values by updating a counter value each time one of the packet identifiers is paired with one of the unique values; and
a set of routines for updating the associative data structure and verifying the identity of one or more of the packets in the verification environment based on the pairs of the packet identifiers and the unique values of the associative data structure.

16. The packet tracking module of claim 15, wherein the verification environment includes a plurality of agents.

17. The packet tracking module of claim 16, wherein the verification environment is for testing operation of a device under test.

18. The packet tracking module of claim 16, wherein the verification environment includes a generator, a reference model and a checker.

19. The packet tracking module of claim 18, wherein the generator generates the packets during the testing, the reference model mimics operation of the device under test, and the checker performs comparisons of data received from the reference model and from the device under test.

20. The packet tracking module of claim 15, wherein the set of routines includes a routine (issuePktId) for issuing an issued packet identifier of the packet identifiers based on the counter, a routine (insertPktId) for inserting an entry of a packet of the packets into the associative data structure, a routine (fetchPktId) for fetching a fetched packet identifier of the packet identifiers from the associative data structure, a routine (removePktId) for removing an entry from the associative data structure, and a routine (eraseTbl) for clearing all entries in the associative data structure.

21. The packet tracking module of claim 20, wherein each routine in the set of routines has no parameters, has only a unique value as a parameter, or has only a unique value and a packet identifier as parameters.

22. The packet tracking module of claim 15, wherein the unique value is a combination of a segment number and a cyclic redundancy check (CRC).

23. The packet tracking module of claim 22, wherein the segment number is stored in a payload of a packet.

24. The packet tracking module of claim 15, wherein a packet identifier for a packet is stored in a payload of the packet, wherein the packet identifier is based on the counter.

25. A method of tracking packets within a verification environment of a testbench, the method comprising:
instantiating a packet tracking module;
maintaining a counter and an associative data structure by the packet tracking module, wherein the associative data structure stores a plurality of packet identifiers and pairs one or more of the packet identifiers with unique values derived from packets within the verification environment, wherein the counter indicates which one of the packet identifiers was most recently paired with one of the unique values by updating a counter value each time one of the packet identifiers is paired with one of the unique values;
generating a first packet of the packets in the verification environment;
in response to generating the first packet, performing a first set of procedures, thereby storing information of the first packet as an entry in the associative data structure and updating the counter; and
performing one or more subsequent sets of procedures each time the first packet is processed, thereby updating the entry in the associative data structure.

26. The method of claim 25, wherein the verification environment includes a generator, a reference model and a checker.

27. The method of claim 26, wherein the generator generates the first packet, the reference model mimics operation of a device under test, and the checker performs comparisons of data received from the reference model and from the device under test.

28. The method of claim 25, wherein the first set of procedures includes:
requesting a packet identifier for the first packet from the packet tracking module;
returning the packet identifier for the first packet by the packet tracking module, wherein the packet identifier for the first packet is based on the counter;
inserting the packet identifier for the first packet into the first packet;
calculating a cyclic redundancy check (CRC) of the first packet; and
inserting the entry for the first packet into the associative data structure using the packet identifier for the first packet and the CRC of the packet.

29. The method of claim 28, wherein the one of the one or more subsequent sets of procedures includes:
obtaining a modified packet, wherein the modified packet is modified from the first packet, wherein the modified packet includes the packet identifier for the first packet;
calculating a CRC of the modified packet;
removing the entry for the first packet from the associative data structure; and
inserting an entry for the modified packet into the associative data structure using the packet identifier and the CRC of the modified packet.

30. The method of claim 28, wherein the one of the one or more subsequent sets of procedures includes:
obtaining a replicated packet, wherein the replicated packet is replicated from the first packet;
requesting a packet identifier for the replicated packet from the packet tracking module;
returning the packet identifier for the replicated packet by the packet tracking module, wherein the packet identifier for the replicated packet is based on the counter;
inserting the packet identifier for the replicated packet into the replicated packet;
calculating CRC of the replicated packet; and
inserting an entry for the replicated packet into the associative data structure using the packet identifier for the replicated packet and the CRC of the replicated packet.

31. The method of claim 28, wherein the one of the one or more subsequent sets of procedures includes:
obtaining a first split packet and a second split packet from the first packet, wherein the first split packet includes a first portion of fields of the first packet and the packet identifier for the first packet, and wherein the second split packet includes a second portion of fields of the first packet and the packet identifier for the first packet;
calculating CRC of each of the two split packets;
inserting an entry for the first split packet into the associative data structure using the packet identifier and a combination of a segment number of the first split packet and the CRC of the first split packet;
inserting a new entry for the second split packet into the associative data structure using the packet identifier and a combination of a segment number of the second split packet and the CRC of the second split packet; and
removing the entry for the first packet from the associative data structure.

32. The method of claim 31, wherein the one of the one or more subsequent sets of procedures includes:

obtaining a merged packet from the first split packet and the second split packet;

calculating CRC for the merged packet;

inserting a new entry for the merged packet into the associative data structure using the packet identifier and a combination of a segment number of the merged packet and the CRC of the merged packet;

removing the entry for the first split packet from the associative data structure; and removing the entry for the second split packet from the associative data structure.

* * * * *

UNITED STATES PATENT AND TRADEMARK OFFICE
CERTIFICATE OF CORRECTION

| | | |
|---|---|---|
| PATENT NO. | : 10,006,963 B2 | Page 1 of 1 |
| APPLICATION NO. | : 14/672016 | |
| DATED | : June 26, 2018 | |
| INVENTOR(S) | : Harish Krishnamoorthy, Nimalan Siva and Vandana Desai | |

It is certified that error appears in the above-identified patent and that said Letters Patent is hereby corrected as shown below:

On the Title Page

In the Inventors section, please replace "Vadana" with – Vandana –.

Signed and Sealed this
Eleventh Day of December, 2018

Andrei Iancu
*Director of the United States Patent and Trademark Office*